(12) United States Patent  (10) Patent No.: US 12,345,847 B2
Kruspe et al.  (45) Date of Patent: Jul. 1, 2025

(54) DOWNHOLE LOGGING USING SYMMETRIC AND ASYMMETRIC COMPENSATED RESISTIVITY MEASUREMENTS

(71) Applicant: Baker Hughes Oilfield Operations LLC, Houston, TX (US)

(72) Inventors: Thomas Kruspe, Celle (DE); Martin Folberth, Celle (DE); Sushant M. Dutta, Sugar Land, TX (US); Andreas Hartmann, Celle (DE); Holger F. Thern, Celle (DE)

(73) Assignee: Baker Hughes Oilfield Operations LLC, Houston, TX (US)

( * ) Notice: Subject to any disclaimer, the term of this patent is extended or adjusted under 35 U.S.C. 154(b) by 133 days.

(21) Appl. No.: 18/200,789

(22) Filed: May 23, 2023

(65) Prior Publication Data
US 2024/0004100 A1   Jan. 4, 2024

Related U.S. Application Data

(60) Provisional application No. 63/344,773, filed on May 23, 2022.

(51) Int. Cl.
*G01V 3/30* (2006.01)
*G01V 3/38* (2006.01)

(52) U.S. Cl.
CPC . *G01V 3/30* (2013.01); *G01V 3/38* (2013.01)

(58) Field of Classification Search
CPC ... G01V 3/30; G01V 3/38; G01V 3/28; G01R 1/02
See application file for complete search history.

(56) References Cited

U.S. PATENT DOCUMENTS

| 6,211,678 B1 | 4/2001 | Hagiwara |
| 11,604,304 B1* | 3/2023 | Wu ........................ G01V 13/00 |
| 2005/0088180 A1 | 4/2005 | Flanagan |
| 2006/0214664 A1* | 9/2006 | Folberth .................. G01V 3/30 |
| | | 324/339 |

(Continued)

OTHER PUBLICATIONS

International Search Report and Written Opinion mailed Sep. 5, 2023 in corresponding PCT Application No. PCT/US23/23245.

*Primary Examiner* — Alvaro E Fortich
(74) *Attorney, Agent, or Firm* — Hogan Lovells US LLP

(57) ABSTRACT

A system herein includes one or more processors to determine asymmetric compensation measurements from at least one receiver antenna pair and at least one transmitter antenna pair on a tool body in an underground formation. The asymmetric compensation measurements are to be used with symmetric compensation measurements from the plurality of antenna pairs. The asymmetric compensation measurements are associated with signals from individual transmitter antennas that are at asymmetric or unequal distances from individual receiver antennas that receive a version of the signals. The individual receiver antennas are part of the at least one receiver antenna pair having symmetrically located receiver antennas with respect to a midpoint of the tool body and the individual transmitter antennas are part of the at least one transmitter antenna pair having symmetrically located transmitter antennas with respect to a midpoint of the tool body.

20 Claims, 11 Drawing Sheets

(56) References Cited

U.S. PATENT DOCUMENTS

| | | | |
|---|---|---|---|
| 2009/0150076 A1* | 6/2009 | Taherian | G01V 3/28 |
| | | | 702/6 |
| 2014/0132420 A1 | 5/2014 | Liu | |
| 2016/0003963 A1* | 1/2016 | Kouchmeshky | G01V 3/28 |
| | | | 702/7 |
| 2018/0138992 A1* | 5/2018 | Kraft | H04B 17/12 |

* cited by examiner

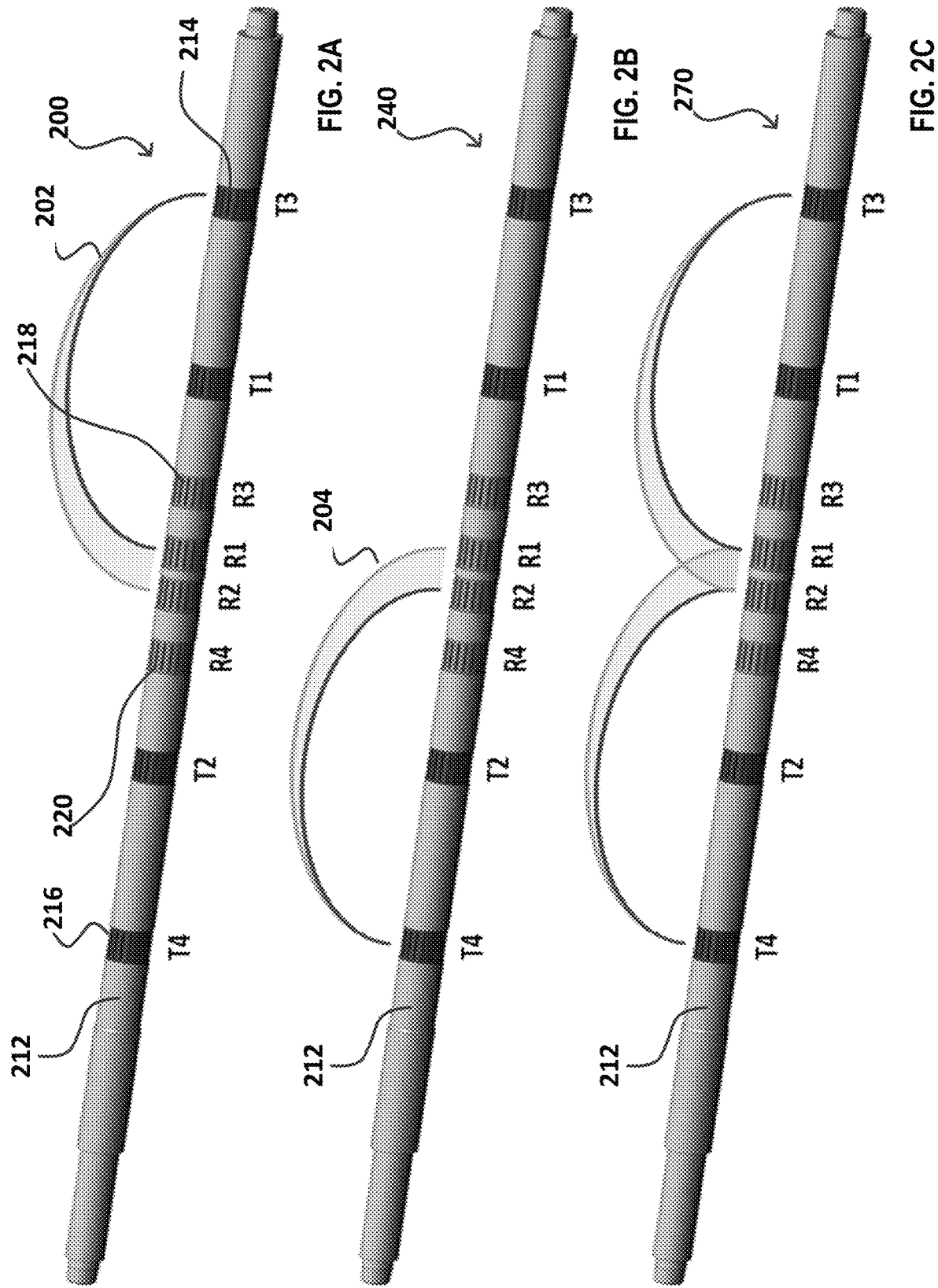

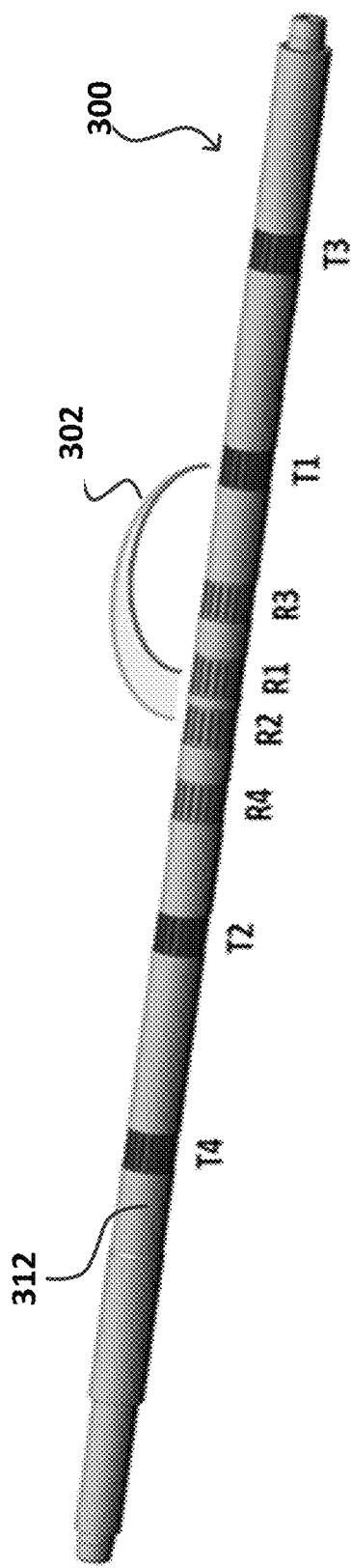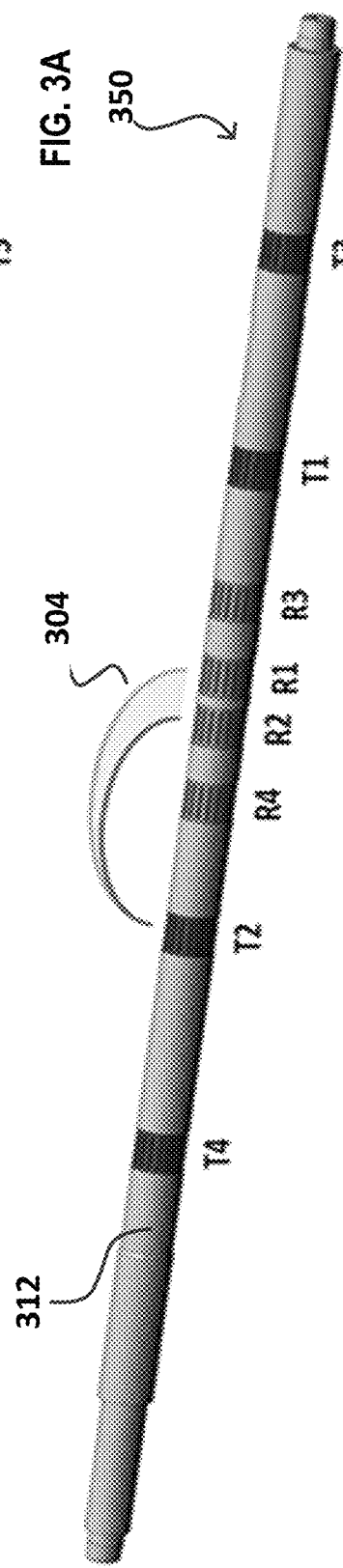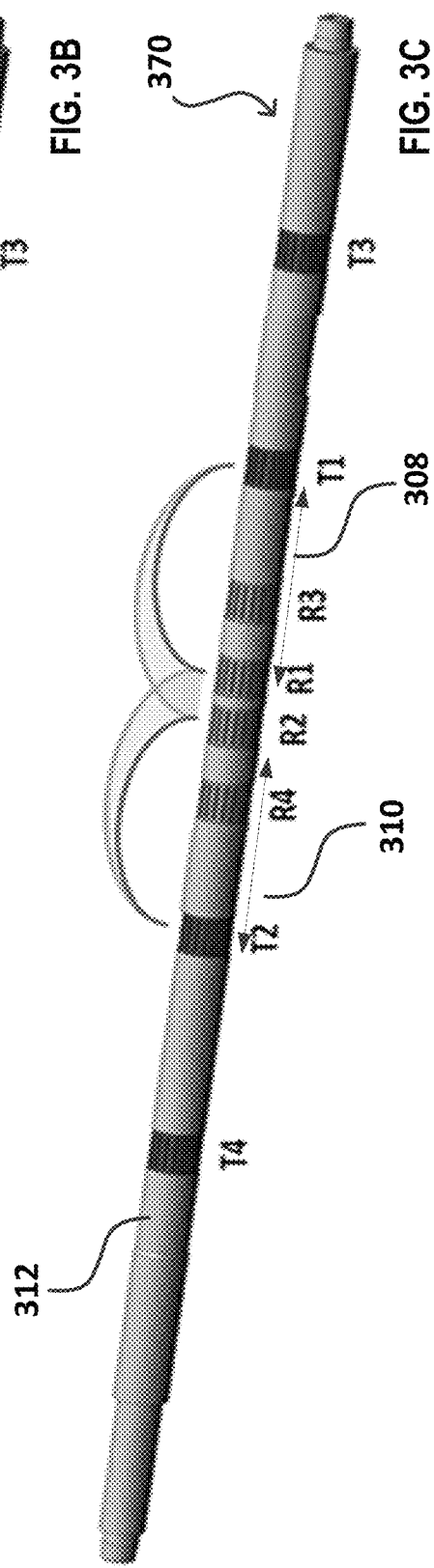

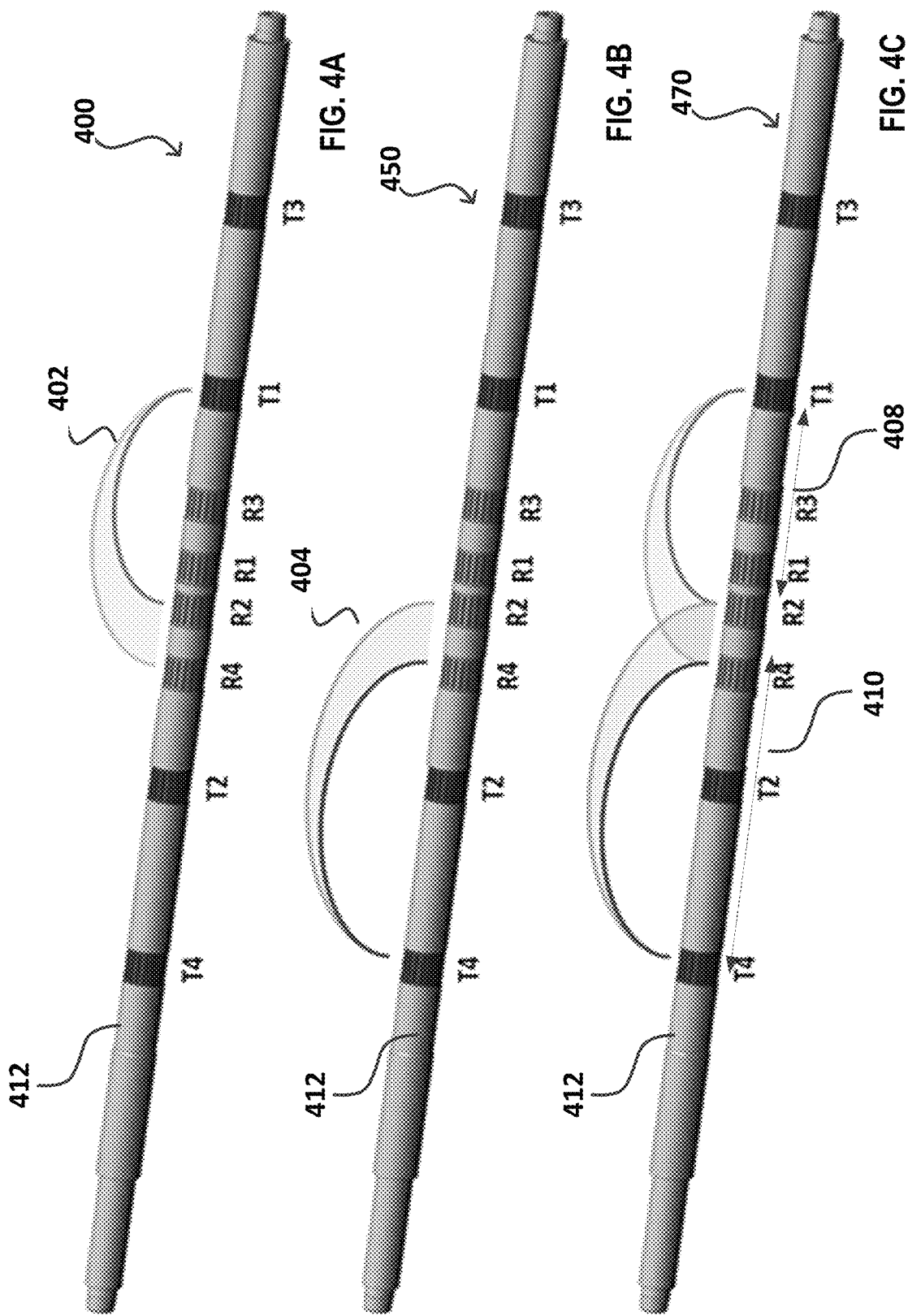

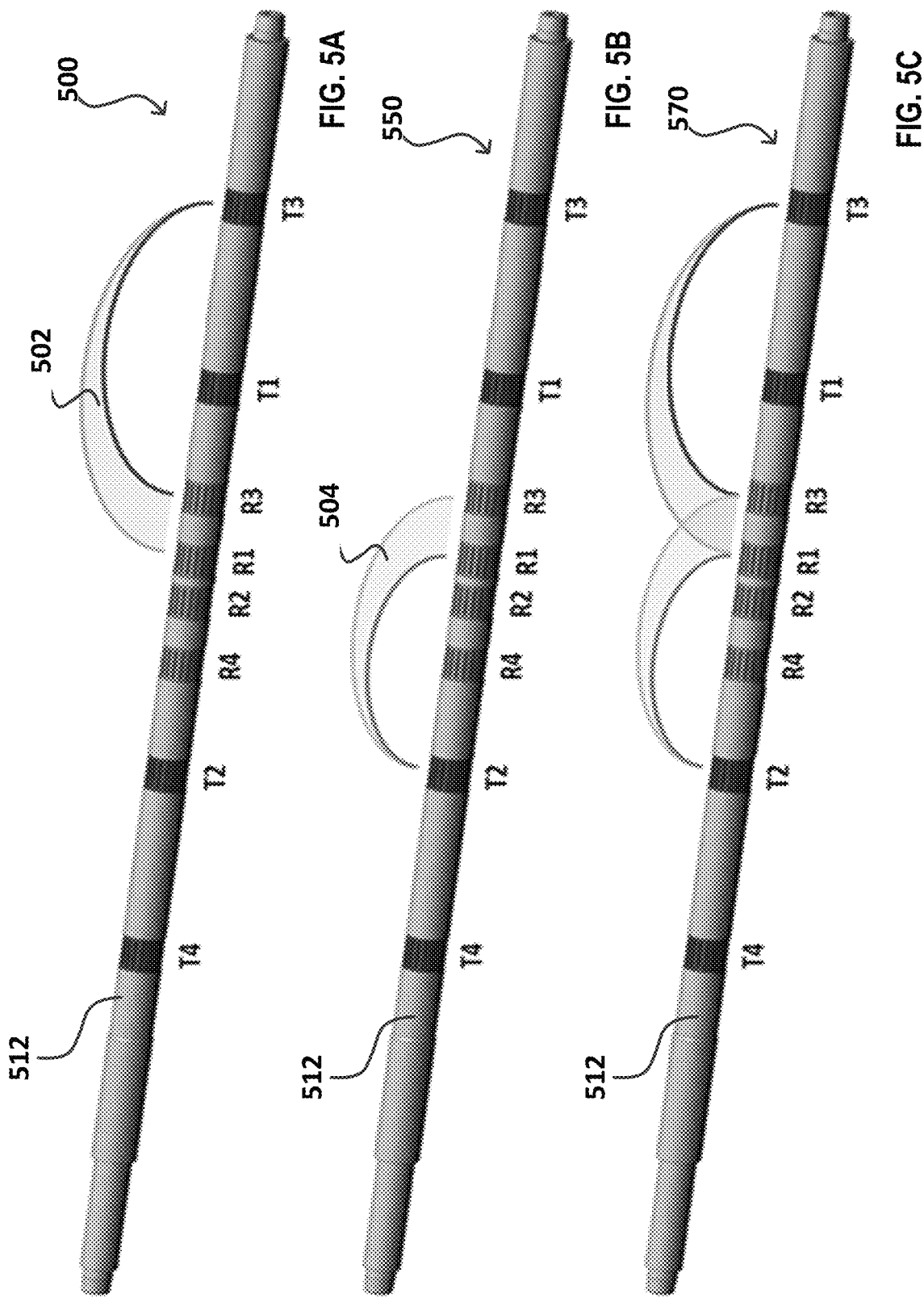

DOWNHOLE LOGGING USING SYMMETRIC AND ASYMMETRIC COMPENSATED RESISTIVITY MEASUREMENTS

CROSS-REFERENCES TO RELATED APPLICATIONS

This application is related to and claims the benefit of priority from U.S. Provisional Application 63/344,773, titled DOWNHOLE LOGGING USING SYMMETRIC AND ASYMMETRIC COMPENSATED RESISTIVITY MEASUREMENTS, filed May 23, 2022, the entire disclosure of which is incorporated by reference herein for all intents and purposes.

BACKGROUND

1. Field

The present disclosure relates to a system and method for performing downhole measurements for downhole logging. Specifically, the present disclosure relates to resistivity logging techniques used in performing downhole measurements.

2. Description of Related Art

As part of drilling of a subsurface formation, during and after such drilling, various types of logging may be performed to obtain formation properties of interest. One such logging technique that may be applied for oil and gas exploration is resistivity logging. Resistivity logging uses resistivity and related electrical interactions of a formation surrounding the drilled borehole. Within resistivity logging, galvanic and inductive coupling are two methods used to feed an electrical signal into the formation, where received signals from the formation may be interpreted to characterize the formation.

SUMMARY

In at least one embodiment, system for downhole electrical logging includes a tool body and a plurality of antenna pairs located on the tool body. The plurality of antenna pairs include at least one receiver antenna pair and at least one transmitter antenna pair. The at least one receiver antenna pair includes individual receiver antennas that are located symmetrically with respect to each other and a midpoint of the tool body. The at least one transmitter antenna pair includes individual transmitter antennas that are located symmetrically with respect to each other and the midpoint of the tool body. The system includes memory and at least one processor to execute instructions from the memory to cause the system to determine asymmetric compensation measurements in the underground formation to be used with symmetric compensation measurements from the plurality of antenna pairs. The asymmetric compensation measurements use signals from the individual transmitter antennas that are at asymmetric or unequal distances from the individual receiver antennas that receive a version of the signals.

In at least one embodiment, a system herein includes one or more processors to determine asymmetric compensation measurements from at least one receiver antenna pair and at least one transmitter antenna pair on a tool body in an underground formation. The asymmetric compensation measurements are to be used with symmetric compensation measurements from the plurality of antenna pairs. The asymmetric compensation measurements are associated with signals from individual transmitter antennas that are at asymmetric or unequal distances from individual receiver antennas that receive a version of the signals. The individual receiver antennas are part of the at least one receiver antenna pair having symmetrically located receiver antennas with respect to a midpoint of the tool body and the individual transmitter antennas are part of the at least one transmitter antenna pair having symmetrically located transmitter antennas with respect to a midpoint of the tool body.

In at least one embodiment, a method for downhole electrical logging includes providing a tool body having a plurality of antenna pairs located on the tool body. The plurality of antenna pairs includes at least one receiver antenna pair and at least one transmitter antenna pair. The at least one receiver antenna pair includes individual receiver antennas that are located symmetrically with respect to each other and a midpoint of the tool body. The at least one transmitter antenna pair includes individual transmitter antennas that are located symmetrically with respect to each other and the midpoint of the tool body. The method includes determining, using at least one processor, asymmetric compensation measurements in the underground formation to be used with symmetric compensation measurements from the plurality of antenna pairs. The asymmetric compensation measurements are associated with signals from the individual transmitter antennas that are at asymmetric or unequal distances from the individual receiver antennas that receive a version of the signals.

In yet another embodiment, a system for downhole electrical logging includes a tool body, an antenna arrangement, and at least one processor within the tool body to execute instructions to cause the system to perform at least a function associated with the antenna arrangement. The antenna arrangement is located on the tool body and includes two or more receiver antennas and two or more transmitter antennas. A function caused in the system is to determine one or more compensated measurements from the antenna arrangement. The one or more compensated measurements have a plurality of depths of investigations (DOIs). A first number of DOIs in the plurality of DOIs is larger than a product of a second number that is of the one or more receiver antennas and that is divided by two, and of a third number that is of the one or more transmitter antennas and that is divided by two.

In yet another embodiment, one or more processors are to determine one or more compensated measurements from an antenna arrangement. The antenna arrangement includes two or more receiver antennas and two or more transmitter antennas on a tool body to be located in an underground formation. The one or more compensated measurements have a plurality of depths of investigations (DOIs). A first number of DOIs in the plurality of DOIs is larger than a product of a second number that is of the one or more receiver antennas and that is divided by two, and of a third number that is of the one or more transmitter antennas and that is divided by two.

Further, another embodiment is to a method to be used with a system for downhole electrical logging. The method includes providing an antenna arrangement located on the tool body. The antenna arrangement includes two or more receiver antennas and two or more transmitter antennas. The method includes executing instructions from memory of the system and using at least one processor within the tool body and causing the system to determine one or more compensated measurements from the antenna arrangement. The one or more compensated measurements have a plurality of depths of investigations (DOIs). A first number of DOIs in the plurality of DOIs is larger than a product of a second number that is of the one or more receiver antennas and that is divided by two, and of a third number that is of the one or more transmitter antennas and that is divided by two.

BRIEF DESCRIPTION OF DRAWINGS

Various embodiments in accordance with the present disclosure will be described with reference to the drawings, in which:

FIGS. 2A-2C and 3A-3C illustrate symmetric measurement schemes using the symmetric resistivity logging tool.

FIGS. 4A-4C and 5A-5C illustrate asymmetric measurement schemes using the symmetric resistivity logging tool, according to at least one embodiment.

DETAILED DESCRIPTION

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described.

Various other functions can be implemented within the various embodiments as well as discussed and suggested elsewhere herein. In at least one embodiment, the present disclosure is to a system and a method for using inductive coupling and associated measurements, and more specifically, using multiple propagation resistivity (MPR) measurements for symmetric and asymmetric measurement schemes in LWD operations.

In at least one embodiment, electromagnetic waves propagate from one or more transmitter coils to one or more receiver coils through a formation, such as an underground formation. In at least one embodiment, the method and system herein include symmetric measurement configurations or arrangements, such as transmitter and receiver coil setups for achieving an increased amount of measurement configurations by also evaluating asymmetric measurement configurations. Symmetric and asymmetric measurement configurations respectively enable or represent the symmetric and asymmetric measurement schemes described further herein.

The symmetric and asymmetric measurement schemes yield additional information for characterizing the formation, such as, in support or geosteering and formation evaluation (FE) applications. In at least one embodiment, the present disclosure provides a resistivity logging technique that utilizes a combination of symmetric and asymmetric compensation of MPR resistivity measurements. This allows for a single tool to provide additional information compared to other resistivity logging methods, such as providing information for more depths of investigation (DOIs) to describe issues discussed herein, including to improve techniques that use only symmetric measurement configurations.

Figure 1:
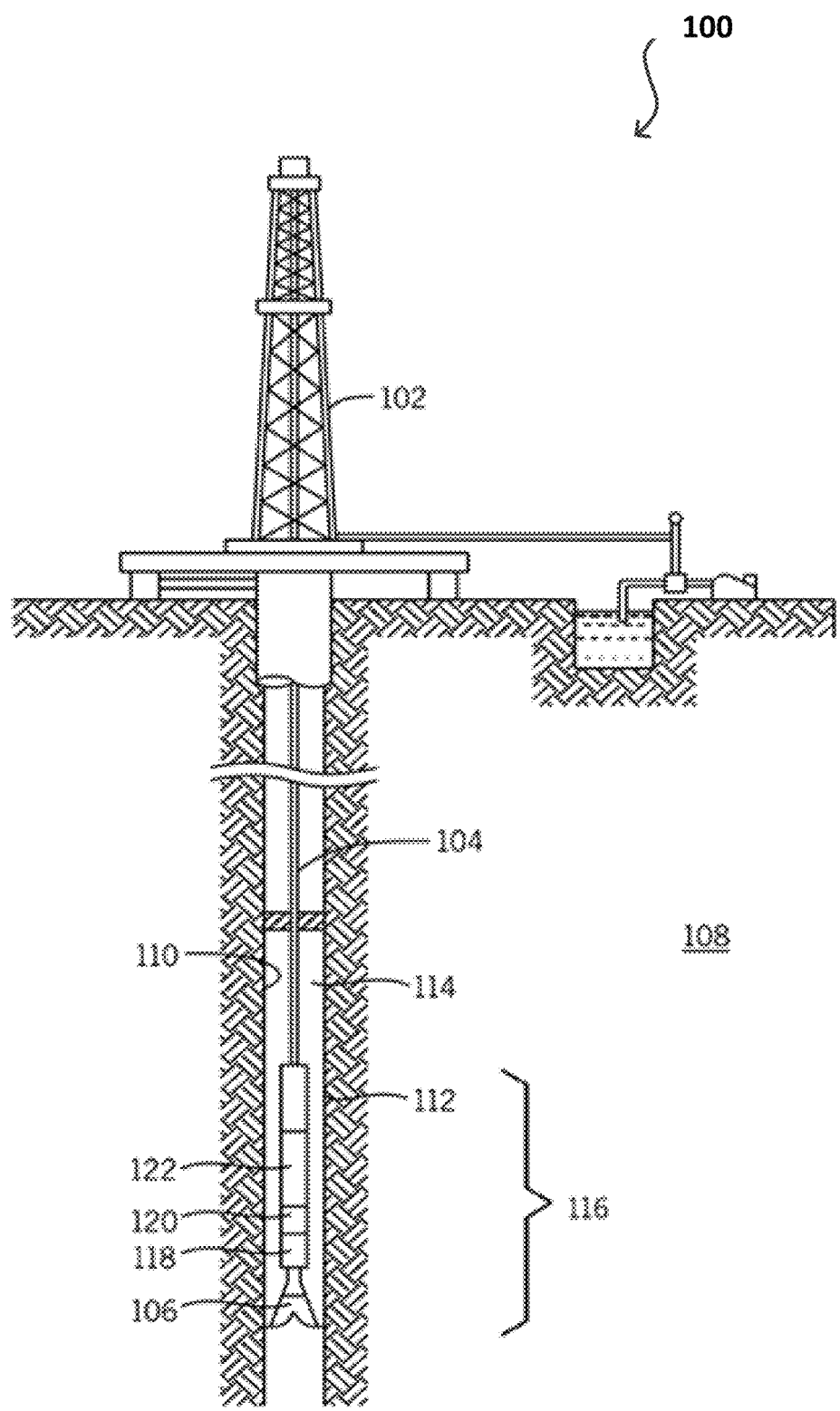
FIG. 1 is a schematic view of an embodiment of a logging while drilling (LWD) system for resistivity logging, in accordance with embodiments of the present disclosure.

FIG. 1 is a schematic view of an embodiment of a logging while drilling (LWD) system 100 for resistivity logging, in accordance with embodiments of the present disclosure. The LWD system 100 may include a rig 102 and a drill string 104 coupled to the rig 102. However, other implementations of a LWD system may incorporate features of a method and system disclosed herein. The drill string 104 includes a drill bit 106 at a distal end that may be rotated to engage an underground or earth formation 108 and form a wellbore 110. The drill string 104 can be formed from one or more tubulars that are mechanically coupled together (such as, via threads, specialty couplings, or the like). As shown, the wellbore 110 includes a borehole sidewall 112 (such as, sidewall) and an annulus 114 between the wellbore 110 and the drill string 104. Moreover, a bottom-hole assembly (BHA) 116 is positioned at the end of the drill string 104. In the example shown, the BHA is positioned at the bottom of the wellbore 110. The BHA 116 may include a drill collar 118, one or more stabilizers 120, or the like.

In at least one embodiment, the LWD system 100 includes various tools 122, such as logging tools and surface logging tools (i.e. tools that are used and located at the earth's surface), which may be utilized to obtain measurements from the formation 108. The logging tools, which are part of the BHA, include, for example, logging while drilling (LWD) tools and may include nuclear tools, acoustic tools, seismic tools, magnetic resonance tools, resistivity tools, sampling tools, and the like. Further, computing aspects may be provided at least as discussed with respect to FIG. 9 to enable a resistivity logging technique that utilizes a combination of symmetric and asymmetric measurement configurations for compensation of MPR resistivity measurements. The various components shown in FIG. 9 may be located above ground at the earth's surface and/or downhole in one of the various tools 122 of the LWD system 100 or some components may be located above ground and other components may be located downhole. When located above ground, such aspects in FIG. 9 may be within the drill site or well site or may be at a remote facility that is other than the drill site or well site.

While an LWD system 100 is described, in part, at least one embodiment herein may be used in a measurement-while-drilling (MWD), measurement-while-tripping (MWT) or a logging-while-tripping (LWT) operation. Further, at least one embodiment herein may be used in a slickline implementation, in a wireline implementation, in a coiled-tubing implementation, or in borehole operations that may incorporate resistivity logging techniques that utilize a combination of symmetric and asymmetric compensation of MPR resistivity measurements. In at least one embodiment, a sensor assembly (such as, a detector/receiver) may be provided to be conveyed downhole on a wireline or slickline. This enables data from the MPR resistivity measurements to be recorded on a suitable memory device and retrieved for subsequent processing.

A resistivity tool or resistivity logging tool includes a number of signal transmitter antennas (part of a transmitter assembly, transmitter tool, or transmitter sub) of the LWD system 100) and a number of receiver antennas (part of a receiver/sensor assembly, receiver/sensor tool, receiver/sensor sub, such as, a sensor/detector/receiver of the LWD system 100). The use of transmitter and receiver antennas enable the resistivity logging tool to measure electromagnetic signals, which can be converted to formation conductivity, resistivity, or permittivity around the borehole or wellbore 110. In at least one embodiment, the resistivity logging tool may include a symmetric arrangement of multiple receiver antennas (such as, two receiver antennas forming one receiver pair) and multiple transmitter antennas (such as, two transmitter antennas forming one transmitter pair). The transmitter/receiver antennas may be positioned symmetrically about a midpoint of the two receiver/transmitter antennas.

One or more such positions of the receiver and the transmitter antennas is illustrated in FIGS. 4A-6B, where the resistivity logging tool includes four receiver antennas and four transmitter antennas. In at least one embodiment, the four receiver antennas and four transmitter antennas are positioned along the tool with two transmitter antennas on each side of the four receiver antennas. The number of transmitter and receiver pairs can be changed and a large number of configurations are possible based on the same principle. Therefore, in FIGS. 4A-6B, at least one receiver antenna pair is illustrated as including individual receiver antennas that are located symmetrically with respect to each other and/or a midpoint of the tool body; and the at least one transmitter antenna pair is illustrated as including individual transmitter antennas that are located symmetrically with respect to each other and/or the midpoint of the tool body.

In at least one embodiment, an electromagnetic signal of one or more frequencies may be emitted from a transmitter and detected by one or more receivers. One or more distance(s) between the transmitter(s) and the receiver(s) may be used to determine a volume around the sensors of the receiver(s). The volume is used to influence certain characteristics of the measurement. The behavior of the electromagnetic signal may be expressed as attenuation and as phase difference of the measured oscillating signal, which is detected at two receiver antennas.

An average radial distance may be reached by the resistivity measurement, where such an average radial distance may be the DOI. Further, the average radial distance may be determined from the center of the tool, where the cumulative contribution to attenuation or phase difference signals is 50% (reflecting a geometric factor that is 0.5). Further description of one such average radial distance may be found in M. Rabinovich, F. Le, J. Lofts, and S. Martakov, 2011, "Deep? How deep and what? The vagaries and myths of look around deep-resistivity measurements while drilling", SPWLA 52nd Annual Logging Symposium Transactions, which is incorporated by reference herein at least as to the average radial distance discussed therein.

In at least one embodiment, the greater the distance between the transmitter and the receivers, the greater is the DOI. As such, it is possible to take measurements by using different distances between transmitter and receiver to provide multiple depths of investigation. Therefore, individual transmitter antennas and individual receiver antennas of antenna pairs and receiver pairs may include a distance there between, on the tool body, that is determined based at least in part on depths of investigation (DOIs) intended for the system herein. Further, an ability to survey, at more DOIs, provides more information about the formation. The receiver and transmitter antennas and electronics may have differences in certain characteristics, such as different gains, moments, offsets, noise, and the like. These characteristics may be different for different individual receivers, transmitters, or other electronics. Further, an exact value of any of the characteristics may not be known. For at least this reason, taking a measurement between a single transmitter and a single receiver may result in an unknown contribution to the measured signal caused in part by the unknown characteristics.

In order to remove (such as, or alternatively, to compensate) for this unknown contribution, measurements, such as an attenuation and/or a phase difference may be measured on a same receiver pair associated with a transmitter pair, with receivers of the receiver pair being on opposite sides of a midpoint from where the measurements of the receiver pair are averaged. Further description of one such compensation process may be found below.

In FIG. 2A, a current $i_x$ flowing in transmitter antenna with index x ($T_x$) 214 may induce a voltage $v_{ant,xy}$ in receiver antenna with index y ($R_y$), wherein indices x and y refer to transmitter index (such as 1, 2, 3, 4 in FIGS. 2A-3C) and receiver index (such as 1, 2, 3, 4 in FIGS. 2A-3C), respectively. In a homogeneous environment, a relationship between $i_x$ and $v_{ant,xy}$, such as a ratio of $i_x$ and $v_{ant,xy}$, can be described by the transfer impedance $Z_{T,xy}$ in Equation (1):

$$Z_{T,xy} = Z_{T,xy}(i_x, v_{ant,xy}) =$$
$$\frac{\omega \mu_0 m_{R,y} m_{T,x}}{2\pi d_{xy}^3} \sqrt{\left(1 + \sqrt{\frac{\omega \mu_0 \sigma}{2}} d_{xy}\right)^2 + \frac{\omega \mu_0 \sigma}{2} d_{xy}^2} \cdot$$
$$e^{-\sqrt{\frac{\omega \mu_0 \sigma}{2}} d_{xy}} \cdot e^{-j\left(\sqrt{\frac{\omega \mu_0 \sigma}{2}} d_{xy} + \arctan\left(\frac{1 + \sqrt{\frac{\omega \mu_0 \sigma}{2}} d_{xy}}{\sqrt{\frac{\omega \mu_0 \sigma}{2}} d_{xy}}\right)\right)}$$

Equation (1)

The parameters in Equation (1) include $m_{R,y}$, $m_{T,x}$, being specific antenna moments of receiver antenna with index y ($R_y$) and transmitter antenna with index x ($T_x$), respectively; $d_{xy}$, being antenna spacing or distance between antennas $T_x$ and $R_y$ in z-direction (i.e., tool axis); $\sigma$, being conductivity of homogeneous environment (i.e., formation); $\omega = 2\pi f$ with f, being the measurement frequency; and $\mu_0$, being permeability of free space, i.e. specific permeability of the environment is assumed to be 1. Further, in air, $\sigma=0$ and the transfer impedance becomes as shown in Equation (2):

$$Z_{T,xy}(\sigma = 0) = \frac{\omega \mu_0 m_{R,y} m_{T,x}}{2\pi d_{xy}^3} \cdot e^{-j\frac{\pi}{2}}$$

Equation (2)

The transfer impedance equation noted above may be derived from first-principle magnetic dipole equations and can therefore assume application in a "bodiless" tool, as well as a no-borehole application, such as, a resistivity tool in a condition where it is not interfacing with a drilling fluid.

Figure 7:
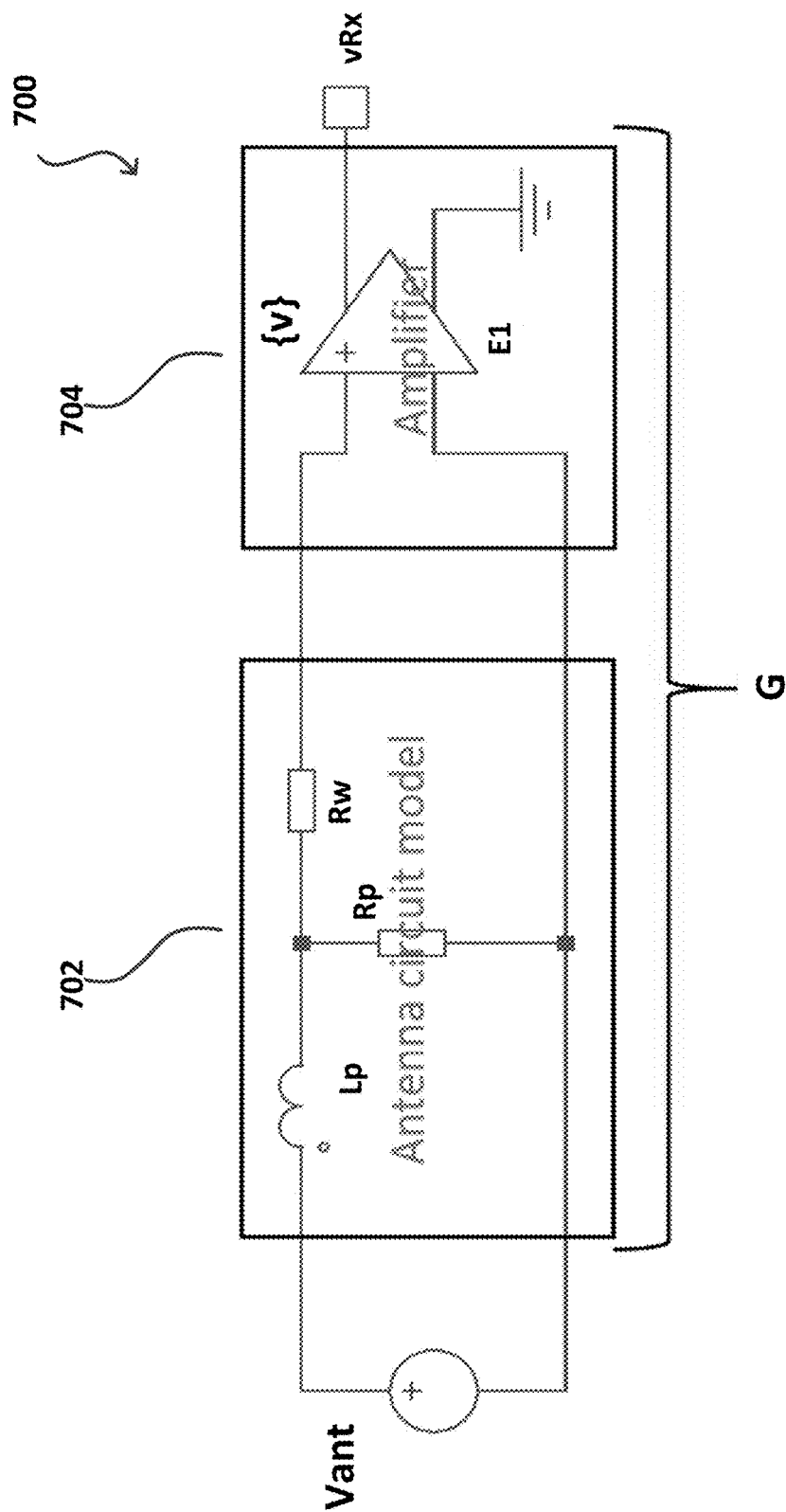
FIG. 7 illustrates receiver electronics that may be part of a propagation resistivity tool for amplifying and converting a receiver antenna voltage for further digital processing, in accordance with at least one embodiment.

The transfer impedance describes a relationship between a transmitter antenna current and receiver antenna induced voltage. In the propagation resistivity tool 212, the receiver antenna voltage $v_{ant,xy}$ may be fed to receiver electronics 700, such as illustrated in FIG. 7. In the receiver electronics 700, the receiver antenna voltage $v_{ant,xy}$ may be amplified in an amplifier 704 and converted via an analog to digital (A-to-D) converter for further digital processing. The amplified signal may optionally further be processed by filtering steps to finally result in a measured receiver voltage $v_{RX,xy}$. In at least one embodiment, the receiver antenna voltage is a signal received at the receiver antenna and may be a version of the signal transmitted by a transmitter into a formation.

The voltage transfer function between $v_{ant,xy}$ and $v_{RX,xy}$ can be expressed as in Equation (3):

$$G_y = \frac{v_{RX,xy}}{v_{ant,xy}} \quad \text{Equation (3)}$$

In Equation (3), $G_y$ is a complex variable and is dependent on temperature, frequency, and mud and formation resistivity. However, it does not depend on the transmitter antenna with index x ($T_x$) nor on the current i x flowing in transmitter antenna with index x ($T_x$). With Equation (3) defined, Equation (4) is provided for the receiver voltage $v_{RX,xy}$ as a function of transmitter current $i_x$:

$$v_{RX,xy} = Z_{T,xy} G_y i_x \quad \text{Equation (4)}$$

In a propagation resistivity tool 212, two measured receiver voltages (e.g., two simultaneously measured receiver voltages) may be combined into a voltage ratio as given in Equation (5):

$$r_{xyz} = \frac{v_{RX,xy}}{v_{RX,xz}} \quad \text{Equation (5)}$$

Where $v_{RX,xz}$ is defined and calculated by Equation (4) in the same way as $v_{RX,xy}$ when index y is replayed by index z (wherein indices z and y both refer to receiver indices, such as 1, 2, 3, 4 in FIGS. 2A-6B). Equation (5) may be further transformed as shown in Equation (6):

$$r_{xyz} = \frac{Z_{T,xy} G_y i_x}{Z_{T,xz} G_z i_x} = \frac{Z_{T,xy} G_y}{Z_{T,xz} G_z} \quad \text{Equation (6)}$$

Particularly, in Equation (6), the transmitter current $i_x$ may be canceled out. The voltage ratio can still include the individual receiver electronics terms $G_y$ and $G_z$ that may be used to describe effects of one or more of amplification or filtering processes. These terms will be addressed, such as, removed or compensated by the compensation measurement described throughout herein.

The voltage ratios may be usually defined such that the distance $d_{xy}$ between transmitter antenna with index x ($T_x$) and receiver antenna with index y ($R_y$) is smaller than the distance $d_{xz}$ between transmitter antenna with index x ($T_x$) and receiver antenna with index z ($R_z$) $d_{xy} < d_{xz}$, such that the receiver antenna with index y ($R_y$) is a near receiver and the receiver antenna with index z ($R_z$) is a far receiver. Then, typically, $|r_{xyz}| > 1$ or, when the ratio is expressed in dB, the sign becomes positive. For the compensation measurements, two voltage ratios may be combined in such a way that the respective receiver electronics transfer functions are canceled out. The measurements of two receivers with indices y and z and generated by two transmitters with indices u and x may be combined to create a compensation measurement (wherein index u refers to a transmitter index, such as 1, 2, 3, 4 in FIGS. 2A-3C). A voltage ratio given by $r_{xyz}$ may be already defined by Equation (6) when transmitter with index x ($T_x$) is fired or triggered. When the second transmitter with index u ($T_u$) is fired or triggered, a different voltage ratio $$r_{uzy} = \frac{v_{RX,uz}}{v_{RX,uy}}$$

is defined. Further, the voltage $v_{RX,uz}$ of receiver antenna with index z ($R_z$) may be defined by a division using a voltage $v_{RX,uy}$ of receiver antenna with index y ($R_y$).

The compensation measurement can take a square root of the voltage ratio product as in Equation (7)

$$r_{comp,uxyz} = \sqrt{r_{xyz} r_{uzy}} \quad \text{Equation (7)}$$

The compensation measurement may be more transparent when substituting the voltage ratios with their actual dependencies as in Equation (8):

$$r_{comp,uxyz} = \sqrt{\frac{Z_{T,xy} G_y}{Z_{T,xz} G_z} \cdot \frac{Z_{T,uz} G_z}{Z_{T,uy} G_y}} = \sqrt{\frac{Z_{T,xy} Z_{T,uz}}{Z_{T,xz} Z_{T,uy}}} \quad \text{Equation (8)}$$

The compensation measurement now contains only the transfer impedances of the respective transmitter-receiver combinations. An influence of the receiver electronics 700 may be removed by at least such a process. In aspects, the term "compensated measurements" refers to measurements that are independent from individual receiver electronics terms as shown.

The compensation measurement may, in at least one embodiment, compensate for more than the receiver electronics 700. For example, the compensation measurement may also remove influences from specific antenna moments in the same fashion as the receiver electronics. Particularly, in at least one embodiment, $Z_{T,xy}$ may be proportional to the product of specific antenna moments $m_{T,x}$ and $m_{R,y}$ (cf. Equation (1)), and this may be the case for subsequent antenna moments. This means that a parameter $r_{comp,uxyz}$ may be proportional to a parameter $$\sqrt{\frac{m_{T,x} m_{R,y}}{m_{T,x} m_{R,z}} \cdot \frac{m_{T,u} m_{R,z}}{m_{T,u} m_{R,y}}}$$

which can be simplified as provided by Equation (9) as all specific antenna moments are canceled out:

$$\sqrt{\frac{m_{T,x} m_{R,y}}{m_{T,x} m_{R,z}} \cdot \frac{m_{T,u} m_{R,z}}{m_{T,u} m_{R,y}}} = 1 \quad \text{Equation (9)}$$

That is, the measured parameter $r_{comp,uxyz}$ as defined by Equations (5) and (7) neither depends on the receiver electronics terms $G_y$, $G_z$ of the respective receiver antennas/receiver electronics $R_y$, $R_z$ nor on the (specific) magnetic moments $m_{T,x}$, $m_{T,u}$, $m_{R,y}$, $m_{R,z}$, of the respective receiver and/or transmitter antennas $T_x$, $T_u$, $R_y$, $R_z$. This holds true irrespective of the individual distances between each pair of antennas $T_x$, $T_u$, $R_y$, $R_z$. In particular, it holds true for a symmetric arrangement of antennas $T_x$, $T_u$, $R_y$, $R_z$ (such that an arrangement of two or more transmitter antennas and two or more receiver antennas that are arranged symmetrically about a common midpoint, i.e., wherein for each of the two or more transmitter/receiver antennas there is a another transmitter/receiver antenna that is at the same distance from the common midpoint) as well as for an asymmetric arrangement of antennas $T_x$, $T_u$, $R_y$, $R_z$. Further, it holds true if one or more or all receiver antennas are closer to the lower/upper end of any of one or more or all transmitter antennas. In aspects, the term "compensated measurements" refers to measurements that are independent from individual receiver electronics terms, from specific magnetic moments of one or more of the transmitter/receiver antennas, or both.

In at least one embodiment, in a propagation resistivity tool having the receiver electronics 700, the voltage ratios for differential and compensation measurements may be traditionally expressed as magnitude and phase difference terms. In one context, the magnitude ratio may be referred to as attenuation and given in decibels (dB) as in Equations (10)-(12) for differential measurements:

$$r_{xyz} = \frac{v_{RX,xy}}{v_{RX,xz}} = \frac{|v_{RX,xy}| \cdot e^{j\varphi_{xy}}}{|v_{RX,xz}| \cdot e^{j\varphi_{xz}}} = \left|\frac{v_{RX,xy}}{v_{RX,xz}}\right| \cdot e^{j(\varphi_{xy}-\varphi_{xz})} \quad \text{Equation (10)}$$

$$Att_{xyz} = 20\log(|r_{xyz}|) = 20\log(|v_{RX,xy}|) - 20\log(|v_{Rx,xz}|)[dB] \quad \text{Equation (11)}$$

$$PD_{xyz} = \arg\{r_{xyz}\} = \varphi_{xy} - \varphi_{xz}[°] \quad \text{Equation (12)}$$

with the phase difference $\varphi_{xy}$ between the transmitter signal of transmitter $T_x$ and the measured receiver voltage of receiver $R_y$ and the phase difference $\varphi_{xz}$ between the transmitter $T_x$ and the receiver voltage of receiver $R_z$.

For the compensation measurement, attenuation and phase differences may be as defined in Equations (13) and (14):

$$Attc_{uxyz} = 20\log(|r_{comp,uxyz}|) = \frac{Att_{xyz} + Att_{uzy}}{2}[dB] \quad \text{Equation (13)}$$

$$PDc_{uxyz} = \arg\{r_{comp,uxyz}\} = \frac{PD_{xyz} + PD_{uzy}}{2}[°] \quad \text{Equation (14)}$$

In Equations (13) and (14), a positive sign is provided due to the complex voltage ratio multiplication and a division by 2 is provided due to the square root in the $r_{comp,uxyz}$ definition.

Furthermore, a so-called air hang correction may be applied to the compensated attenuation and to phase difference measurements, which normalize the measurement response to 0 dB attenuation and 0° phase difference in air by measuring and then subtracting the respective results in air for $\sigma=0$ as in Equations (15) and (16):

$$Attcah_{uxyz}=Attc_{uxyz}-Attc_{uxyz}(\sigma=0) \quad \text{Equation (15)}$$

$$PDcah_{uxyz}=PDc_{uxyz}-PDc_{uxyz}(\sigma=0) \quad \text{Equation (16)}$$

All attenuation-to-resistivity and phase difference-to-resistivity transformations may be calculated for air hang correction using Equations (15) and (16). With reference to FIG. 2A, in at least one embodiment, when receivers 3 (218) and 4 (220) and transmitters 3 (214) and 4 (216) are the long receiver, long transmitter combination, then their respective indices are u=3, x=4, y=4, z=3, and a distance to index table can be generated as in Table 1:

TABLE 1

|  |  | Transmitter Index | |
|---|---|---|---|
|  |  | u = 3 | x = 4 |
| Receiver | y = 4 | $d_{34}$ | $d_{44}$ |
| Index | z = 3 | $d_{33}$ | $d_{43}$ |

Then, an associated voltage ratio for such receivers 3 and 4 and transmitters 3 and 4 may be given by Equation (17):

$$r_{comp,3443} = \sqrt{\frac{Z_{T,44}Z_{T,33}}{Z_{T,43}Z_{T,34}}} \quad \text{Equation (17)}$$

Further, distances may be taken where $d_{33}=d_{44}$ and $d_{43}=d_{34}$. This is a symmetric arrangement as it has common midpoint which is at the center point between receiver antennas $R_3$ and $R_4$ with $R_3$ and $R_4$ having the same distance to said common midpoint and $T_3$ and $T_4$ having the same distance to said common midpoint. In some embodiments, Z values may be taken as Z, $Z_{T,44}=Z_{T,33}$ and $Z_{T,43}=Z_{T,34}$, where the compensation measurement can be simplified to $$r_{comp,3443} = \frac{Z_{T,33}}{Z_{T,34}},$$

which reflects a ratio of transfer impedances between one of the transmitters and near and far receivers.

In at least one embodiment, an unconventional combination may be used as a supplement to the symmetrical array measurements. For example, as illustrated in FIGS. 5A-C, receiver antennas $R_1$ and $R_3$ and transmitters $T_3$ and $T_2$ may be used. In this case, the respective indices are u=3, x=2, y=1, z=3, and a distance to index table can be generated as in Table 2:

TABLE 2

|  |  | Transmitter Index | |
|---|---|---|---|
|  |  | u = 3 | x = 2 |
| Receiver | y = 1 | $d_{31}$ | $d_{21}$ |
| Index | z = 3 | $d_{33}$ | $d_{23}$ |

This is an asymmetric arrangement as no midpoint can be defined between the four antennas so that for each of the four transmitter/receiver antennas there is another transmitter/receiver antenna that is at the same distance from the common midpoint. Then, a compensation measurement for such receivers $R_1$ and $R_3$ and transmitters $T_3$ and $T_2$ may be given by Equation (18):

$$r_{comp,2313} = \sqrt{\frac{Z_{T,31}Z_{T,23}}{Z_{T,33}Z_{T,21}}} \quad \text{Equation (18)}$$

No further simplifications of the compensation measurement $r_{comp,2313}$ may be possible. However, the specific antenna moment cancelation, as shown in Equation (9), also works in this case. Such features demonstrate that any receiver antenna combination can be used for a compensation measurement. In particular, any receiver antenna combination also includes the ones which have a different midpoint for the receiver pair and the transmitter pair.

FIGS. 2A-3C illustrate symmetric measurement schemes using a symmetric resistivity logging tool. The configuration illustrates receivers $R_1$ to $R_4$ and distinct transmitters $T_1$ to $T_4$ on a resistivity tool 212 in an LWD system 100, for instance. The lower end of the resistivity tool 212 (i.e., the end that is closer to the drill bit 106 along the wellbore 110) is shown on the right side of FIGS. 2A-3C and the upper end of the resistivity tool 212 (i.e., the end that is closer to the rig 102 along the wellbore 110) is shown on the left side of FIGS. 2A-3C (and similar for FIGS. 4A-6B). For example, in FIGS. 2A-2C, a first measurement can be determined using the configurations 200-270 at a first depth of investigation (DOI) by using a pair of receivers (or receiver antennas) $R_1$ and $R_2$ to measure a first signal 202 when a first transmitter (or transmitter antenna) $T_3$ is fired or triggered, and also using the pair of receivers $R_1$ and $R_2$ to measure a second signal 204 when a second transmitter $T_4$ is fired or triggered. Further, the first measurement may include additional measurements, all taken at a first DOI.

Compensation calculations may be performed to obtain an accurate final signal for the first DOI according to Equations (15) and (16) with u=3, x=4, y=1 and z=2. Still further, in FIGS. 3A-3C, a second measurement can be determined at a second DOI by using a pair of receivers $R_1$ and $R_2$ to measure a third signal 302 when a first transmitter $T_1$ is fired or triggered; and by using a pair of receivers $R_1$ and $R_2$ to measure a fourth signal 304 when a second transmitter $T_2$ is fired or triggered. Like in FIGS. 2A-2C, compensation calculations may be performed to obtain a more accurate final signal for the second DOI according to Equations (15) and (16) with u=1, x=2, y=1 and z=2. Notably, the distances between transmitter antennas and receiver antennas are much shorter in the configuration of FIGS. 3A-3C compared to the configuration of FIGS. 2A-2C leading to smaller DOI.

Furthermore, the two DOIs described with respect to FIGS. 2A-2C and 3A-3C may be obtained through symmetrical compensation. For example, in FIGS. 2A-2C, a first distance 308 between a transmitter $T_3$ and a pair of receivers $R_1$, $R_2$ (taken collectively) or to the midpoint between the pair of receivers $R_1$, $R_2$ may be the same or substantially the same as a second distance 310 between a second transmitter $T_4$ and the same pair of receivers $R_1$, $R_2$ (taken collectively) or to the midpoint between the pair of receivers $R_1$, $R_2$. Such same or substantially same distances make the scheme or configuration in FIGS. 2A-2C and 3A-3C symmetrical with respect to the transmitter to receiver pairs on opposite sides of a mid-point of a resistivity tool 212; 312. This is illustrated in the combined receipt of signals scheme or configuration 270; 370 in FIGS. 2C and 3C.

FIGS. 4A-5C illustrate exemplary asymmetric measurement schemes using the symmetric resistivity logging tool, in accordance with at least one embodiment. For example, in FIGS. 4A-5C asymmetric combinations of transmitter and receiver pairs may be used to determine measurements with additional DOIs than referenced in FIGS. 2A-3C. In contrast to the first distance 308 and the second distance 310 of FIG. 3C being symmetric, asymmetric combinations of transmitter and receiver pairs may be due to different distances 408, 410 between transmitters (such as $T_1$ and $T_4$) that are used with any receiver pairs (such as $R_2$ and $R_4$), at any point in time, on opposite sides of a mid-point of a resistivity tool 412; 512.

Particularly, FIGS. 4A-5C illustrate that even though transmitter pairs $T_1$, $T_2$ and $T_3$, $T_4$ are each located symmetrically with respect to each other, within each pair, and with respect to their common midpoint and similarly the receiver pairs $R_1$, $R_2$ and $R_3$, $R_4$ are each located symmetrically with respect to each other, within each pair, and with respect to their common midpoint, which allows for symmetric compensation measurements, asymmetric compensation measurements may be taken using such receiver antenna pairs and such transmitter antenna pairs by using signals from individual transmitter antennas (of the transmitter antenna pairs) that are in an asymmetrical configuration or scheme with respect to individual receiver antennas (of the receiver antenna pairs). The asymmetrical configuration or scheme, therefore, includes using signals triggered or fired from individual transmitter antennas (of different symmetrical transmitter pairs) that are at asymmetric or at unequal distances from the midpoint of the receiver antennas used to measure signals that are caused by the individual transmitter antennas.

In an example, referring to schemes or configurations 400-470 of FIGS. 4A-4C, a third measurement can be taken at a third DOI by using a pair of receivers $R_4$ and $R_2$ of a resistivity tool 412. The measurement uses a fifth signal 402 when a first transmitter $T_1$ is fired or triggered and uses a first pair of receivers $R_4$ and $R_2$ to measure a version of the fifth signal received; and also uses a sixth signal 404 when a second transmitter $T_4$ is fired, with the same first pair of receivers $R_4$ and $R_2$ to measure a version of the sixth signal received.

Here, the asymmetrical configuration or scheme is illustrated where signals 402, 404 are triggered or fired from individual transmitter antennas $T_1$ or $T_4$ (of different symmetrical transmitter pairs $T_1$, $T_2$ or $T_3$, $T_4$) that are at asymmetric or unequal distances 408, 410 from individual receiver antennas $R_2$ or $R_4$ (of the different symmetrical receiver pairs $R_1$, $R_2$ or $R_3$, $R_4$) that receive a version of the signals 402, 404. The asymmetric compensation measurements can be used with symmetric compensation measurements from these same antenna pairs by triggering or firing from individual transmitter antennas $T_1$, $T_2$ or $T_3$, $T_4$ (i.e., using the same symmetrical transmitter pairs) that are at symmetric or equal distances from individual receiver antennas $R_1$ or $R_2$ (i.e., using the same symmetrical receiver pairs) that receive a version of the signals.

In other words, the individual receiver antennas $R_2$ or $R_4$ are part of the at least one receiver antenna pair having symmetrically located receiver antennas ($R_1$, $R_2$ or $R_3$, $R_4$) with respect to a midpoint of the tool body and the individual transmitter antennas $T_1$ or $T_4$ are part of the at least one transmitter antenna pair having symmetrically located transmitter antennas ($T_1$, $T_2$ or $T_3$, $T_4$) with respect to a midpoint of the tool body.

Compensation calculations may be performed to obtain an accurate final signal for this DOI according to Equations (12) and (13) with u=1, x=4, y=2 and z=4. In at least one embodiment, FIGS. 5A-5C provide a second measurement that can be taken at the third DOI at which the schemes or configurations 400-470 of FIGS. 4A-4C were previously applied. In at least one embodiment, the schemes or configurations 500-570 of FIGS. 5A-5C include the use of different receiver pairs $R_3$ and R and transmitters $T_2$ and $T_2$ than in the schemes or configurations 400-470 of FIGS. 4A-4C. However, in some cases, as illustrated in at least FIG. 6A, it is possible to have a second measurement taken at a fourth DOI in the asymmetric configuration depending on the asymmetric combination of transmitter and receiver pairs used. In aspects, the methods as illustrated allow for a symmetric antenna arrangement comprising $N_T$ transmitter antennas and $N_R$ receiver antennas that allow for a number $N_{DOI}$ of measurements at different DOIs where $N_{DOI}$ is larger than the product $$\frac{N_T}{2} \cdot \frac{N_R}{2}.$$

Accordingly, since a number of measurements at different DOIs can be used to model a formation with a number $N_{Layer}$ of different layers having different distances from the borehole, the methods as illustrated allow for a symmetric antenna arrangement comprising $N_T$ transmitter antennas and $N_R$ receiver antennas that allow to model a formation with a number $N_{Layer}$ of different layers having different distances from the borehole where $N_{Layer}$ is larger than the product $$\frac{N_T}{2} \cdot \frac{N_R}{2}.$$

For example, the symmetric antenna arrangement of the resistivity logging tool shown in FIGS. 2A-6B may allow measurements with more than four DOIs which in turn may allow to model a formation with more than four layers with different distances from the borehole.

In one embodiment, the symmetric antenna arrangement comprising $N_T$ transmitter antennas and $N_R$ receiver antennas allows for a number $N_{DOI}$ of measurements at different DOIs where $N_{DOI}$ is $$\frac{1}{2} \cdot \frac{N_T(N_T-1)}{2} \cdot \frac{N_R(N_R-1)}{2}.$$

For example, the symmetric antenna arrangement of the resistivity logging tool shown in FIGS. 2A-6B may allow measurements with 18 DOIs which in turn may allow to model a formation with 18 layers with different distances from the borehole. If an asymmetric arrangement is used, $N_{DOI}$ may be up to $$\frac{N_T(N_T-1)}{2} \cdot \frac{N_R(N_R-1)}{2}.$$

Figure 9:
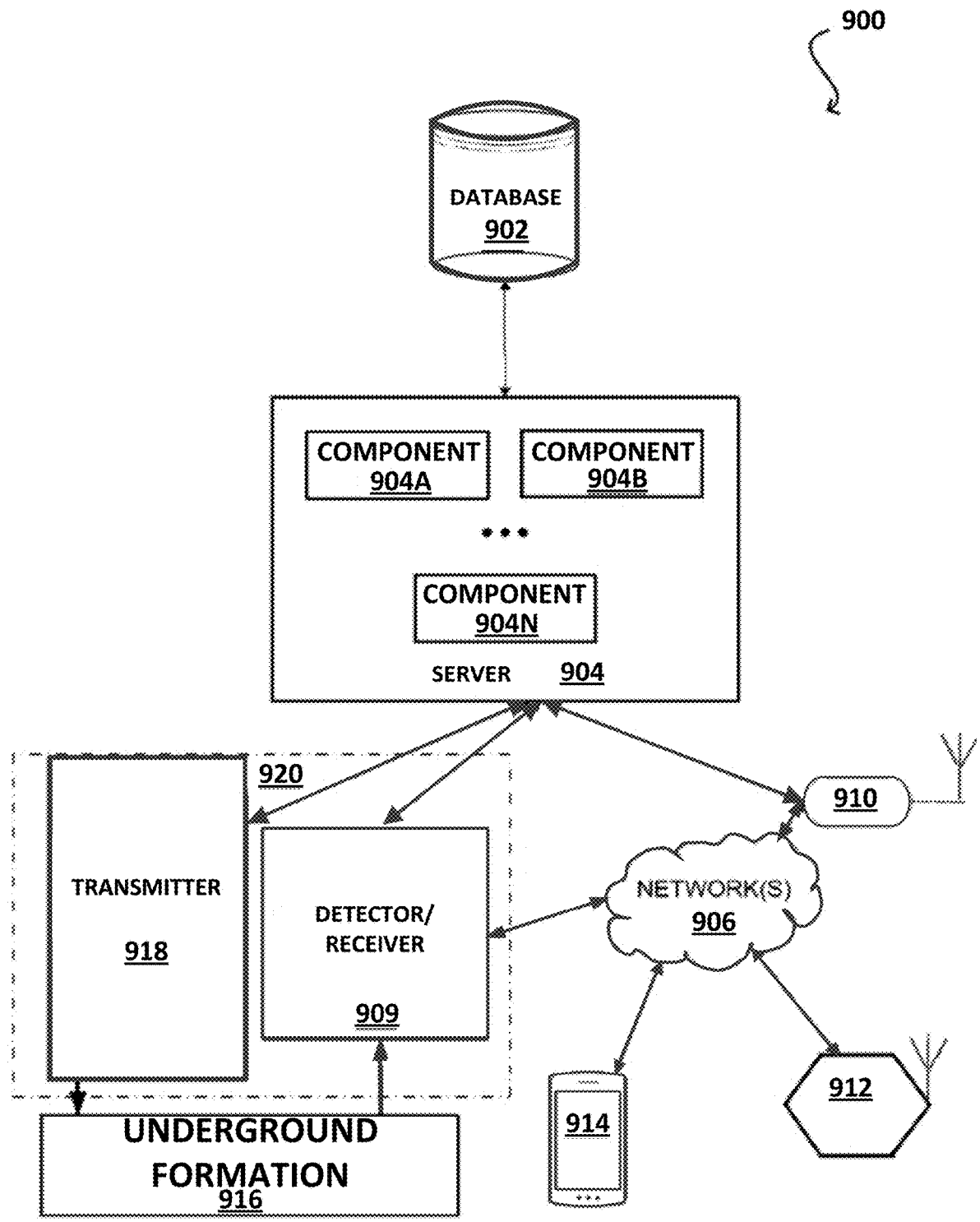
FIG. 9 is a system adapted for performing an improvement to data quality from symmetric and asymmetric configurations of transmitter and receiver pairs, according to at least one embodiment.

Such models may be provided via one or more of the components 904A-N of the server 902 in FIG. 9.

The illustrated schemes or configurations 500-570 enable a measure of a seventh signal when transmitter $T_3$ is fired or triggered and also uses a receiver pair $R_3$ and $R_1$ a version of the seventh signal received; and a measure of an eighth signal when a different transmitter $T_2$ is fired or triggered to cause a version of the eighth signal to be received. As the schemes or configuration 500-570 in FIGS. 5A-5C are a mirrored configuration of FIGS. 4A-4C, with respect to the receiver pairs (such as $R_2$, $R_4$ versus $R_1$, $R_3$) and the transmitter pairs (such as $T_1$, $T_4$ versus $T_3$, $T_2$) on either sides of a midpoint of the antenna arrangement $T_1$, $T_2$, $T_3$, $T_4$, $R_1$, $R_2$, $R_3$, $R_4$, a same compensation logic applies as discussed with respect to schemes or configurations 400-470 of FIGS. 4A-4C and the same DOI is used.

In the context of this disclosure, the term "mirrored" antenna configuration refers to a symmetric antenna arrangement where a first asymmetric antenna sub-arrangement in that symmetric antenna arrangement comprises a first receiver antenna pair and a first transmitter antenna pair that are utilized to provide a first asymmetric compensated measurement and where a second asymmetric antenna sub-arrangement that is referred to as "mirrored" to the first asymmetric antenna sub-arrangement comprises a second receiver antenna pair and a second transmitter antenna pair that are utilized to provide a second asymmetric compensated measurement, wherein at least one of the receiver antennas in the first receiver pair is different from the each of the receiver antennas in the second receiver pair or wherein at least one of the transmitter antennas in the first transmitter pair is different from each of the receiver antennas in the second transmitter pair, and wherein all transmitter-receiver distances in the first asymmetric antenna sub-arrangement are substantially the same as in the second asymmetric antenna sub-arrangement. Particularly, as illustrated, an adjustment to the asymmetric compensation measurements is possible by averaging data from mirrored configurations or sub-arrangements (such as asymmetric sub-arrangements) of the symmetric antenna arrangement shown in FIGS. 4A-4C and FIGS. 5A-5C (such as sub-arrangement $T_1$, $T_4$, $R_2$, $R_4$ in FIGS. 4A-4C and sub-arrangement $T_2$, $T_3$, $R_1$, $R_3$ in FIGS. 5A-5C).

While the schemes or configurations 400-570 are illustrative, more compensated configurations can be extracted from these schemes or configurations 400-570. For example, such more compensated configurations may be obtained by combining different receiver pairs and transmitters. In at least one embodiment, the DOI, in at least the asymmetric configurations may not be identical. FIGS. 4 and 5 have the configurations with the most similar DOIs.

In at least one embodiment, the data quality of the asymmetric configurations described in at least FIGS. 4A-5C may be further improved by averaging the mirrored configurations. For example, the DOI may remain the same in mirrored asymmetric sub-arrangements or configurations by selections of mirrored transmitter and receiver pairs, but unwanted effects can further cancel out and the signal-to-noise ratio can be increased. Such averaging may be done using data taken at a same or substantially same time, but other times may be considered if adequate compensation is achieved. For example, adjustment to one or more of the symmetric compensation measurements or the asymmetric compensation measurements in FIGS. 4A-5C may be performed using averaging of data from the at least one receiver antenna pair (such as, $R_1$ and $R_3$ in FIGS. 5A-5C, $R_2$ and $R_4$ of FIGS. 4A-4C, or even the symmetric antenna pairs $R_1$, $R_2$ or $R_3$, $R_4$) and the at least one transmitter antenna pair (such as, $T_2$ and $T_3$ in FIGS. 5A-5C, $T_1$ and $T_4$ of FIGS. 4A-4C, or even the symmetric antenna pairs $RT_1$, $T_2$ or $T_3$, $T_4$), where the data is obtained at a time point that is a same time or within the same time interval that may be defined by a threshold of the time point, reflecting that the time may be a substantially same time.

For example, adjustment to one or more of symmetric or asymmetric compensation measurements in FIGS. 4A-5C may be performed using averaging of data from mirrored configurations or sub-arrangements (such as asymmetric sub-arrangements) of the symmetric antenna arrangement shown in FIGS. 4A-4C and FIGS. 5A-5C (such as sub-arrangement $T_1$, $T_4$, $R_2$, $R_4$ in FIGS. 4A-4C and sub-arrangement $T_2$, $T_3$, $R_1$, $R_3$ in FIGS. 5A-5C) where the data is obtained from the mirrored configurations or sub-arrangements at a time point that is a same time or within the same time interval that may be defined by a threshold of the time point, reflecting that the time may be a substantially same time.

Figure 6A:
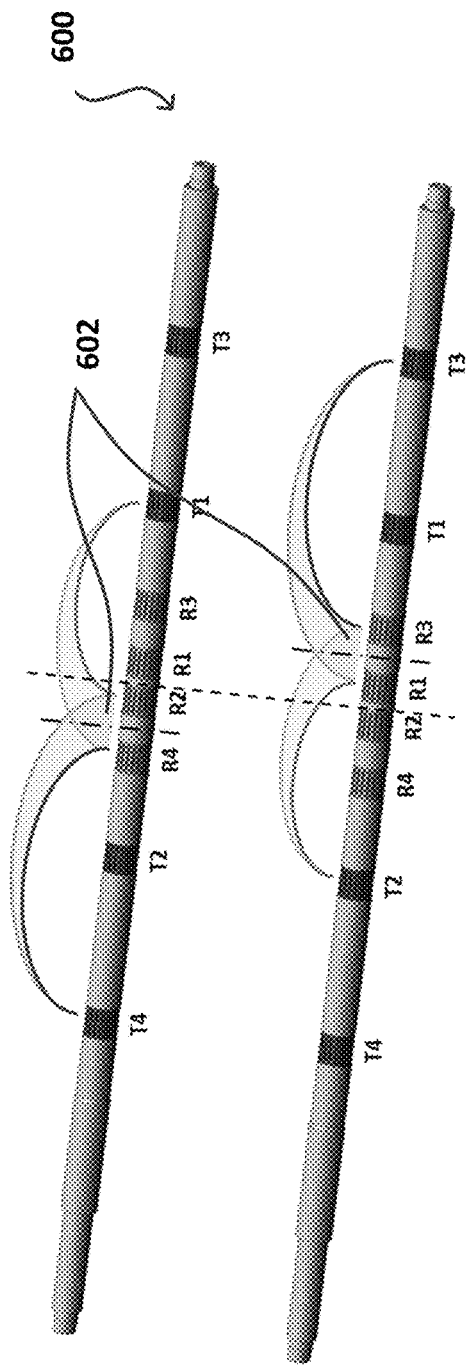
FIGS. 6A-6B illustrate the averaging of asymmetric measurement schemes to further improve the data quality, according to at least one embodiment.
Figure 6B:
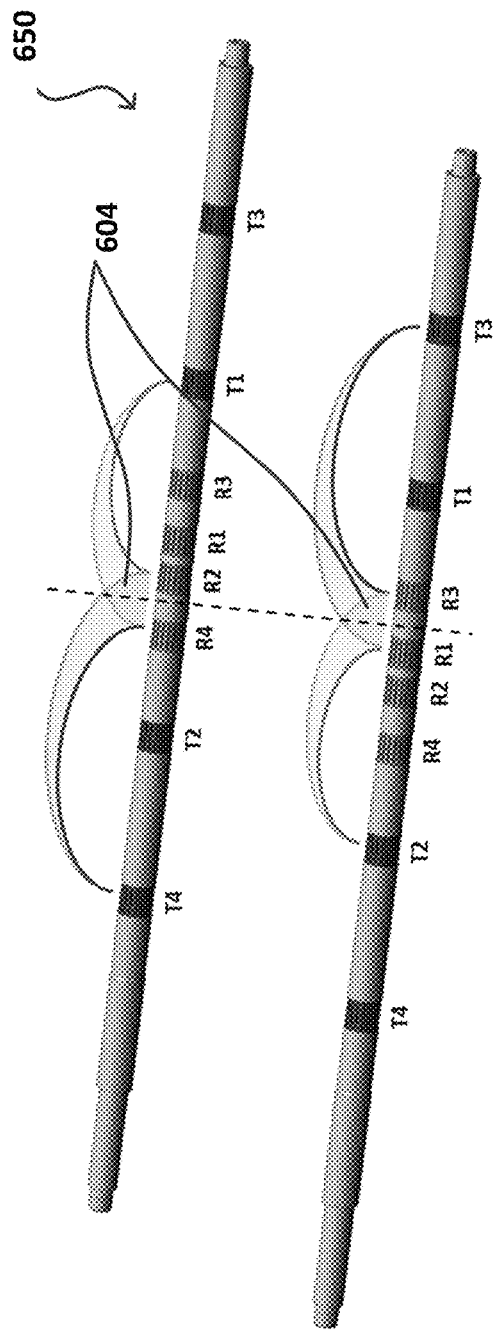

FIGS. 6A-6B illustrate the averaging of asymmetric measurement schemes to further improve the data quality, according to at least one embodiment. As illustrated in FIG. 6A, a spatial correlation 602 of a measured formation may not be optimal in a first configuration 600. However, the data quality may be improved by averaging data, such as compensated measurements, measured at two different times when the averaged volumes have maximum spatial correlation 604. Such a maximum spatial correlation 604 may result in improved vertical resolution of data from asymmetric configurations 600, 650. For example, adjustment to one or more of the symmetric compensation measurements or the asymmetric compensation measurements in FIGS. 4A-5C may be performed using averaging of data from first and second mirrored configurations or first and second sub-arrangements (such as first and second asymmetric sub-arrangements) of the symmetric antenna arrangement shown in FIGS. 4A-4C and FIGS. 5A-5C (such as first sub-arrangement $T_1$, $T_4$, $R_2$, $R_4$ in FIGS. 4A-4C and second sub-arrangement $T_2$, $T_3$, $R_1$, $R_3$ in FIGS. 5A-5C), where the data is spatially correlated to a logging depth, such as in FIG. 1, in the underground formation.

For example, the data of the first sub-arrangement (such as $T_1$, $T_4$, $R_2$, $R_4$ in FIGS. 4A-4C) is measured at a first time or in a first time interval and the data of the second sub-arrangement (such as second sub-arrangement $T_2$, $T_3$, $R_1$, $R_3$ in FIGS. 5A-5C) is measured at a second time or in a second time interval, wherein the first time and the second time are unequal and or wherein the first time interval and the second time interval are not completely overlapping. The difference of the first and second time or the first and second time interval may be selected according to the distance the resistivity logging tool progresses while drilling during the time difference between the first and second times or the time difference between the first and second time intervals. In aspects, the difference of the first and second time or the first and second time interval may be selected so that the distance the resistivity logging tool progresses while drilling during the time difference between the first and second times or the time difference between the first and second time intervals is related to one or more distances between two transmitter antennas, two receiver antennas, or a transmitter antenna and a receiver antenna.

For example, as shown in the example configuration of FIG. 6B, the data of the first sub-arrangement $T_1$, $T_4$, $R_2$, $R_4$ is measured at a first time or in a first time interval and the data of the second sub-arrangement $T_2$, $T_3$, $R_1$, $R_3$ is measured at a second time or in a second time interval, wherein the first time or time interval is later than the second time second time interval. The difference of the first and second time or the first and second time interval may be selected in this example, so that the distance the resistivity logging tool progresses while drilling during the time difference between the first and second times or the time difference between the first and second time intervals equals the sum of half of the distance between receiver antennas $R_2$ and $R_4$, half of the distance between receiver antennas $R_1$ and $R_3$, and the distance between receiver antennas $R_1$ and $R_3$. In this configuration the time difference between first and second time or first and second time interval may be selected to equal the sum of half of the distance between receiver antennas $R_2$ and $R_4$, half of the distance between receiver antennas $R_1$ and $R_3$, and the distance between receiver antennas $R_1$ and $R_3$ divided by the rate of penetration of the resistivity logging tool.

As such, a resistivity tool herein may have symmetrical layout of transmitter and receiver pairs. For example, a resistivity tool may have four transmitter antennas and four receiver antennas, where the four receiver antennas form two receiver pairs. Measurements can be taken at multiple DOI and, by applying a depth-based averaging, the vertical resolution and the data quality obtained in such measurements can be further improved. In at least one embodiment, a resistivity tool may have a different number of transmitter antennas and/or receiver antennas to accommodate additional measurement configurations based on the same concepts.

In at least one embodiment, antenna pairs are located on a tool (and particularly on a tool body of the tool). The antenna pairs include at least one receiver antenna pair and at least one transmitter antenna pair. The arrangement of the antenna pairs enables the at least one receiver antenna pair to be located symmetrically with respect to a midpoint and the at least one transmitter antenna pair to be located symmetrically with respect to the midpoint. This implies that each receiver antenna of the at least one receiver antenna pair is symmetric to the other receiver antennas of the at least one receiver antenna pair and to the midpoint of the antenna arrangement. This also implies that each transmitter antenna is located symmetrically with respect to other transmitter antennas of the at least one transmitter antenna pair and to the midpoint of the tool. As such, the schemes or configurations covered include, but are not limited to: T-T-R-R-T-T; T-R-R-R-R-T; T-R-T-T-R-T; and R-T-R-R-T-R where T is a transmitter antenna and R is a receiver antenna and each is symmetric to a respective antenna and to the midpoint.

Figure 8A:
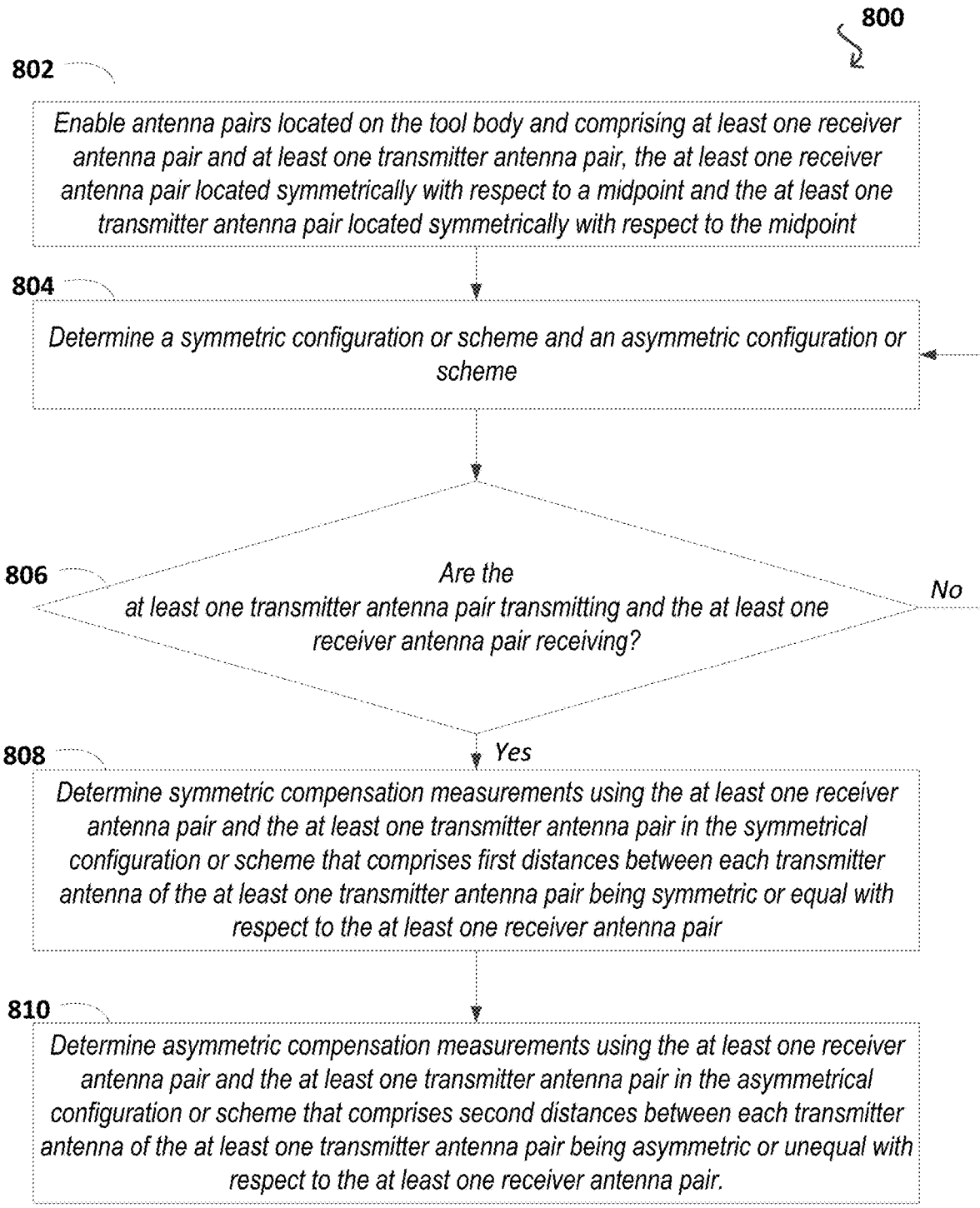
FIG. 8A is a flowchart illustrating a method to improve data quality from symmetric and asymmetric configurations of transmitter and receiver pairs, according to at least one embodiment.

FIG. 8A is a flowchart of a method 800 to improve data quality from symmetric and asymmetric configurations of transmitter and receiver pairs, according to at least one embodiment. Step 802 is to enable antenna pairs to be located on a tool body and to include at least one receiver antenna pair and at least one transmitter antenna pair, where the at least one receiver antenna pair is located symmetrically with respect to a midpoint and the at least one transmitter antenna pair is located symmetrically with respect to the midpoint. Step 804 is to determine a symmetric configuration or scheme and an asymmetric configuration or scheme. This step may be achieved by activating certain ones of the transmitter antennas (referred to generally as transmitters) with certain receiver antenna pairs (referred to generally as receiver pairs).

Step 806 is a verification step to ensure that transmitters are transmitting and receivers are receiving according to the symmetric configuration or scheme and the asymmetric configuration or scheme. Step 808 is performed if the verification is successful otherwise step 804 may be repeated.

Step 808 is to determine symmetric compensation measurements using the at least one receiver antenna pair and the at least one transmitter antenna pair in the symmetrical configuration or scheme that includes first distances between each transmitter antenna of the at least one transmitter antenna pair being symmetric or equal with respect to the at least one receiver antenna pair.

Step 810 may be performed to determine asymmetric compensation measurements using the at least one receiver antenna pair and the at least one transmitter antenna pair in the asymmetrical configuration or scheme that includes second distances between each transmitter antenna of the at least one transmitter antenna pair being asymmetric or unequal with respect to the at least one receiver antenna pair.

Figure 8B:
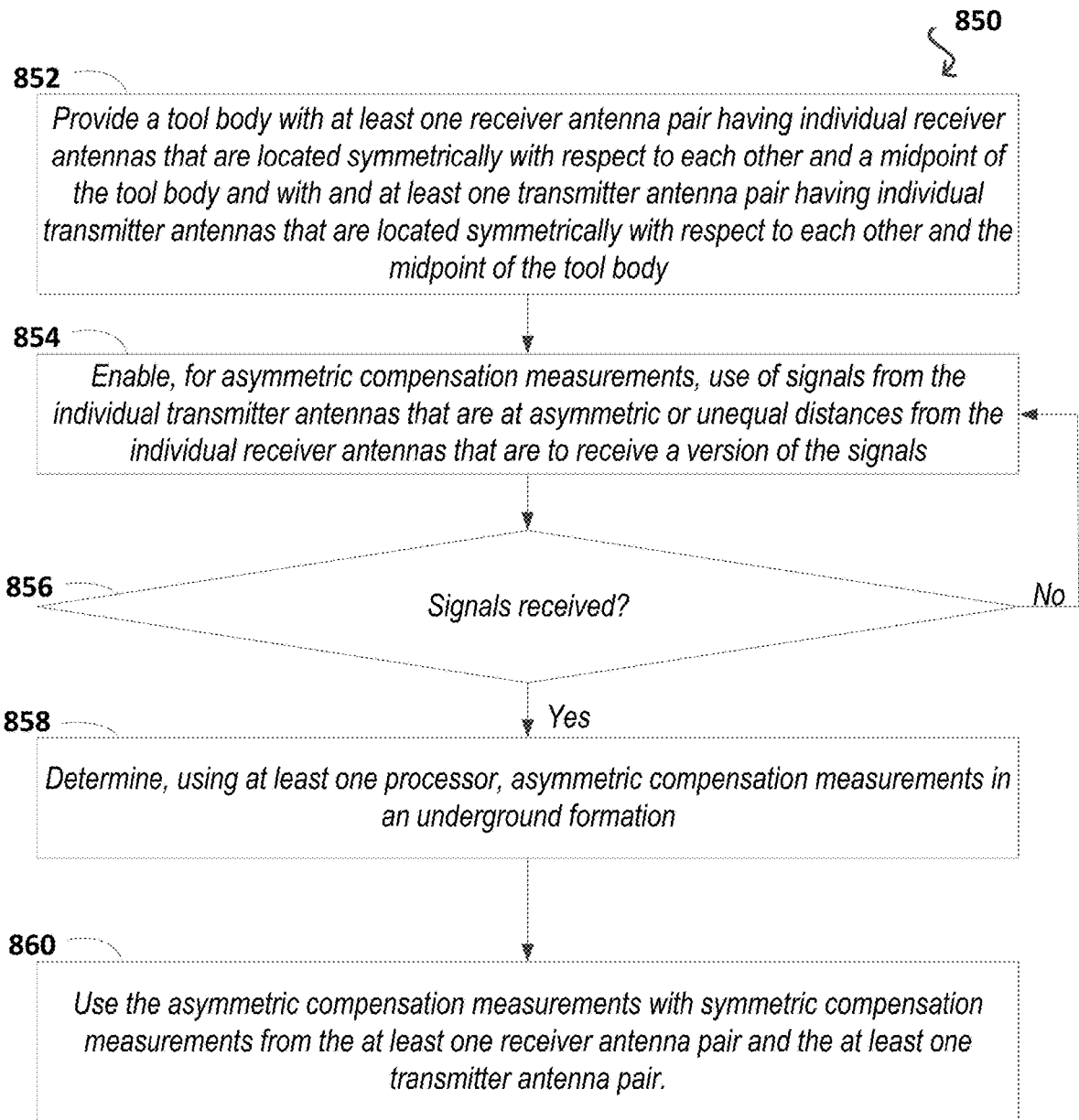
FIG. 8B is another flowchart illustrating a further method to improve data quality from symmetric and asymmetric configurations of transmitter and receiver pairs, according to at least one embodiment.

FIG. 8B is another flowchart illustrating a further method 850 to improve data quality from symmetric and asymmetric configurations of transmitter and receiver pairs, according to at least one embodiment. The method 850 is for downhole electrical logging and includes a step 852 of providing a tool body comprising multiple antenna pairs located on the tool body. The antenna pairs include at least one receiver antenna pair and at least one transmitter antenna pair. The at least one receiver antenna pair includes individual receiver antennas that are located symmetrically with respect to each other and a midpoint of the tool body. The at least one transmitter antenna pair includes individual transmitter antennas that are located symmetrically with respect to each other and the midpoint of the tool body.

The method 850 includes a step 854 of enabling, for asymmetric compensation measurements, use of signals from the individual transmitter antennas that are at asymmetric or unequal distances from the individual receiver antennas that receive a version of the signals. The method 850 includes a step 856 for verifying that signals are received. The method 850 includes determining, using at least one processor, asymmetric compensation measurements in an underground formation using the signals. The method 850 includes a step 860 to use the asymmetric compensation measurements with symmetric compensation measurements from the antenna pairs. The asymmetric compensation measurements are therefore associated with signals from the individual transmitter antennas that are at asymmetric or unequal distances from the individual receiver antennas that receive a version of the signals.

The method 850 may include a further step or sub-step for determining the symmetric compensation measurements from the antenna pairs using signals from the individual transmitter antennas that are at symmetric or equal distances from the individual receiver antennas that receive a version of the signals. The method 850 may include a further step or sub-step for adjusting the asymmetric compensation measurements by averaging data from mirrored configurations of different ones of the individual transmitter antennas that are also the at asymmetric or unequal distances from different ones of the individual receiver antennas.

The method 850 may include a further step or sub-step for adjusting one or more of the symmetric compensation measurements or the asymmetric compensation measurements using averaging of data from the at least one receiver antenna pair and the at least one transmitter antenna pair. The data may be spatially correlated to a logging depth in the underground formation.

The method 850 may include a further step or sub-step for adjusting one or more of the symmetric compensation measurements or the asymmetric compensation measurements using averaging of data from the at least one receiver antenna pair and the at least one transmitter antenna pair. The data may be obtained at a time point or within a threshold of the time point.

The method 850 may include using the individual transmitter antennas and the individual receiver antennas with a distance there between that is determined based at least in part on a plurality of depths of investigation (DOIs) intended for the system. The method 850 may include using the symmetric compensation measurements and the asymmetric compensation measurements with one or more of an attenuation measurement or a phase difference measurement applied thereto. The method 850 may include using the plurality of antenna pairs with four receiver antennas to form two of the at least one receiver antenna pair and with four transmitter antennas to form two of the at least one transmitter antenna pair.

Figure 8C:
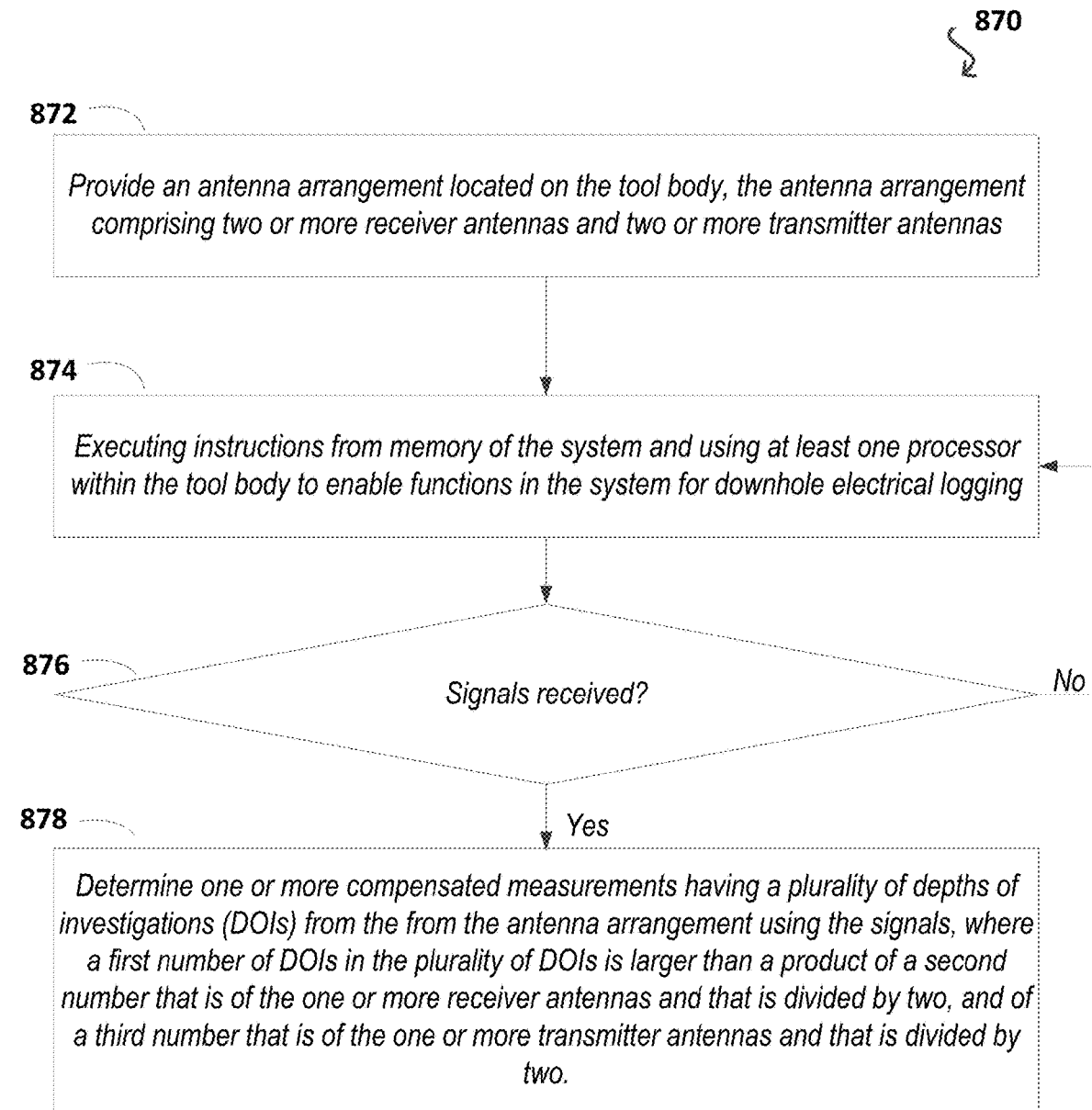
FIG. 8C is yet another flowchart illustrating a further method to improve data quality from symmetric and asymmetric configurations of transmitter and receiver pairs, according to at least one embodiment.

FIG. 8C is yet another flowchart illustrating a further method 870 to improve data quality from symmetric and asymmetric configurations of transmitter and receiver pairs, according to at least one embodiment. The method 870 is to be used with a system for downhole electrical logging. The method 870 includes providing (872) an antenna arrangement located on the tool body. The antenna arrangement includes two or more receiver antennas and two or more transmitter antennas. The method 870 includes executing (872) instructions from memory of the system and using at least one processor within the tool body to cause functions for the downhole electrical logging. When signals are received (876) in the system, the method 870 includes causing (878) the system to determine one or more compensated measurements from the antenna arrangement using the signals. The one or more compensated measurements have a plurality of depths of investigations (DOIs). A first number of DOIs in the plurality of DOIs is larger than a product of a second number that is of the one or more receiver antennas and that is divided by two, and of a third number that is of the one or more transmitter antennas and that is divided by two.

In at least one embodiment, computer and network aspects 900 may be used for performing an improvement to data quality from symmetric and asymmetric configurations of transmitter and receiver pairs as illustrated in FIGS. 1-8B and may be used as described herein. In at least one embodiment, these computer and network aspects 900 may include a distributed system. In at least one embodiment, a distributed system 900 may include one or more computing devices 912, 914. In at least one embodiment, one or more computing devices 912, 914 may be adapted to execute and function with a client application, such as with browsers or a stand-alone application, and are adapted to execute and function over one or more network(s) 906.

In at least one embodiment, a server 904, having components 904A-N may be communicatively coupled with computing devices 912, 914 via network 906 and via a receiver device 908, if provided. In at least one embodiment, components 912, 914 include processors, memory and random-access memory (RAM). In at least one embodiment, server 904 may be adapted to operate services or applications to manage functions and sessions associated with database access 902 and associated with computing devices 912, 914. In at least one embodiment, server 904 may be associated with a receiver or detector device 908 having the receiver antenna of a tool 920. Further, while a receiver or detector device 908 is illustrated distinctly from a transmitter device 918, this is only as to the transmitter components causing corresponding transmitter antenna described with respect to FIGS. 2A-6B to transmit a signal and to the receiver components causing corresponding receiver antennas to receive a version of the signal, which may be referred to plainly as the same transmitted signal for example purposes.

In at least one embodiment, server 904 may be at a well site location, but may also be at a distinct location from a wellsite location. In at least one embodiment, such a server 904 may support or be associated with a tool 920 (such as, one of tools 122 described in connection with FIG. 1 or a tool that is a resistivity tool). Such a tool may include one or more transmitters 918 and one or more receivers or detectors 908 that are each coupled to respective transmitter antennas and respective receiver antennas. A transmitter 918 provides signals or waves for the transmitter antennas to pass into an underground formation 916. The receiver or detector device 908 of the tool 920 can receive one or more returned or reflected signals or waves from a formation via the one or more receiver antennas.

In at least one embodiment, a system for downhole electrical logging may include aspects that are adapted to transmit, either through wires or wirelessly, information received therein, from a detector or a receiver back to the surface. In at least one embodiment, such information may be received in a receiver device and transmitted from there. In at least one embodiment, a server 904 may function as a detector or receiver device but may also perform other functions. In at least one embodiment, one or more component 904A-N may be adapted to function as a detector or receiver device within a server 904. In at least one embodiment, one or more components 904A-N may include one or more processors and one or more memory devices adapted to function as a detector or receiver device, while other processors and memory devices in server 904 may perform other functions.

In at least one embodiment, a server 904 may also provide services or applications that are software-based in a virtual or a physical environment. In at least one embodiment, when server 904 is a virtual environment, then components 904A-N are software components that may be implemented on a cloud. In at least one embodiment, this feature allows remote operation of a system as discussed at least in reference to FIGS. 1-7. In at least one embodiment, this feature also allows for remote access to information received and communicated between any of aforementioned devices. In at least one embodiment, one or more components 904A-N of a server 904 may be implemented in hardware or firmware, other than a software implementation described throughout herein. In at least one embodiment, combinations thereof may also be used.

In at least one embodiment, one computing device 910-914 may be a smart monitor or a display having at least a microcontroller and memory having instructions to enable display of information monitored by a detector or receiver device. In at least one embodiment, one computing device 910-912 may be a transmitter device to transmit directly to a receiver device or to transmit via a network 906 to a receiver device 908 and to a server 904, as well as to other computing devices 912, 914.

In at least one embodiment, other computing devices 912, 914 may include portable handheld devices that are not limited to smartphones, cellular telephones, tablet computers, personal digital assistants (PDAs), and wearable devices (head mounted displays, watches, etc.). In at least one embodiment, other computing devices 912, 914 may operate one or more operating systems including Microsoft Windows Mobile®, Windows® (of any generation), and/or a variety of mobile operating systems such as iOS®, Windows Phone®, Android®, BlackBerry®, Palm OS®, and/or variations thereof.

In at least one embodiment, other computing devices 912, 914 may support applications designed as internet-related applications, electronic mail (email), short or multimedia message service (SMS or MMS) applications and may use other communication protocols. In at least one embodiment, other computing devices 912, 914 may also include general purpose personal computers and/or laptop computers running such operating systems as Microsoft Windows®, Apple Macintosh®, and/or Linux®. In at least one embodiment, other computing devices 912, 914 may be workstations running UNIX® or UNIX-like operating systems or other GNU/Linux operating systems, such as Google Chrome OS®. In at least one embodiment, thin-client devices, including gaming systems (Microsoft Xbox®) may be used as other computing device 912, 914.

In at least one embodiment, network(s) 906 may be any type of network that can support data communications using various protocols, including TCP/IP (transmission control protocol/Internet protocol), SNA (systems network architecture), IPX (Internet packet exchange), AppleTalk®, and/or variations thereof. In at least one embodiment, network(s) 906 may be a networks that is based on Ethernet, Token-Ring, a wide-area network, Internet, a virtual network, a virtual private network (VPN), a local area network (LAN), an intranet, an extranet, a public switched telephone network (PSTN), an infra-red network, a wireless network (such as that operating with guidelines from an institution like the Institute of Electrical and Electronics (IEEE) 802.11 suite of protocols, Bluetooth®, and/or any other wireless protocol), and/or any combination of these and/or other networks.

In at least one embodiment, a server 904 runs a suitable operating system, including any of operating systems described throughout herein. In at least one embodiment, server 904 may also run some server applications, including HTTP (hypertext transport protocol) servers, FTP (file transfer protocol) servers, CGI (common gateway interface) servers, JAVA® servers, database servers, and/or variations thereof. In at least one embodiment, a database 902 is supported by database server feature of a server 904 provided with front-end capabilities. In at least one embodiment, such database server features include those available from Oracle®, Microsoft®, Sybase®, IBM® (International Business Machines), and/or variations thereof.

In at least one embodiment, a server 904 is able to provide feeds and/or real-time updates for media feeds. In at least one embodiment, a server 904 is part of multiple server boxes spread over an area but functioning for a presently described process for fast in-field chromatography. In at least one embodiment, server 904 includes applications to measure network performance by network monitoring and traffic management. In at least one embodiment, a provided database 902 enables information storage from a wellsite, including user interactions, usage patterns information, adaptation rules information, and other information.

In some embodiments, the relationships between variance values and corresponding characteristics or status of components of well structure may be established through historical data or lab-generated data. This information may take the form of an index or algorithm. In some embodiments, a machine learning approach may be utilized in which training data includes known variance values and corresponding well structure status. An input of new variance values can produce predicted well structure status information based on the machine learning model trained on such data.

It should be appreciated that embodiments herein may utilize one or more values that may be experimentally determined or correlated to certain performance characteristics based on operating conditions under similar or different conditions. The present disclosure described herein, therefore, is well adapted to carry out the objects and attain the ends and advantages mentioned, as well as others inherent therein. While a presently preferred embodiment of the disclosure has been given for purposes of disclosure, numerous changes exist in the details of procedures for accomplishing the desired results. These and other similar modifications will readily suggest themselves to those skilled in the art and are intended to be encompassed within the spirit of the present disclosure disclosed herein and the scope of the appended claims.

While techniques herein may be subject to modifications and alternative constructions, these variations are within spirit of present disclosure. As such, certain illustrated embodiments are shown in drawings and have been described above in detail, but these are not limiting disclosure to specific form or forms disclosed; and instead, cover all modifications, alternative constructions, and equivalents falling within spirit and scope of disclosure, as defined in appended claims.

Terms such as a, an, the, and similar referents, in context of describing disclosed embodiments (especially in context of following claims), are understood to cover both singular and plural, unless otherwise indicated herein or clearly contradicted by context, and not as a definition of a term. Including, having, including, and containing are understood to be open-ended terms (meaning a phrase such as, including, but not limited to) unless otherwise noted. Connected, when unmodified and referring to physical connections, may be understood as partly or wholly contained within, attached to, or joined together, even if there is something intervening.

Recitation of ranges of values herein are merely intended to serve as a shorthand method of referring individually to each separate value falling within range, unless otherwise indicated herein and each separate value is incorporated into specification as if it were individually recited herein. In at least one embodiment, use of a term, such as a set (for a set of items) or subset unless otherwise noted or contradicted by context, is understood to be nonempty collection including one or more members. Further, unless otherwise noted or contradicted by context, term subset of a corresponding set does not necessarily denote a proper subset of corresponding set, but subset and corresponding set may be equal.

Conjunctive language, such as phrases of form, at least one of A, B, and C, or at least one of A, B and C, unless specifically stated otherwise or otherwise clearly contradicted by context, is otherwise understood with context as used in general to present that an item, term, etc., may be either A or B or C, or any nonempty subset of set of A and B and C. In at least one embodiment of a set having three members, conjunctive phrases, such as at least one of A, B, and C and at least one of A, B and C refer to any of following sets: {A}, {B}, {C}, {A, B}, {A, C}, {B, C}, {A, B, C}. Thus, such conjunctive language is not generally intended to imply that certain embodiments require at least one of A, at least one of B and at least one of C each to be present. In addition, unless otherwise noted or contradicted by context, terms such as plurality, indicates a state of being plural (such as, a plurality of items indicates multiple items). In at least one embodiment, a number of items in a plurality is at least two but can be more when so indicated either explicitly or by context. Further, unless stated otherwise or otherwise clear from context, phrases such as based on means based at least in part on and not based solely on.

Operations of a method or sub-steps described herein can be performed in any suitable order unless otherwise indicated herein or otherwise clearly contradicted by context. In at least one embodiment, a method includes processes such as those processes described herein (or variations and/or combinations thereof) that may be performed under control of one or more computer systems configured with executable instructions and that may be implemented as code (e.g., executable instructions, one or more computer programs or one or more applications) executing collectively or exclusively on one or more processors, by hardware or combinations thereof.

In at least one embodiment, such code may be stored on a computer-readable storage medium. In at least one embodiment, such code may be a computer program having instructions executable by one or more processors. In at least one embodiment, a computer-readable storage medium is a non-transitory computer-readable storage medium that excludes transitory signals (such as a propagating transient electric or electromagnetic transmission) but includes non-transitory data storage circuitry (such as buffers, cache, and queues) within transceivers of transitory signals. In at least one embodiment, code (such as executable code or source code) is stored on a set of one or more non-transitory computer-readable storage media having stored thereon executable instructions (or other memory to store executable instructions) that, when executed (such as a result of being executed) by one or more processors of a computer system, cause computer system to perform operations described herein.

In at least one embodiment, a set of non-transitory computer-readable storage media includes multiple non-transitory computer-readable storage media and one or more of individual non-transitory storage media of multiple non-transitory computer-readable storage media lack all of code while multiple non-transitory computer-readable storage media collectively store all of code. In at least one embodiment, executable instructions are executed such that different instructions are executed by different processors—in at least one embodiment, a non-transitory computer-readable storage medium store instructions and a main central processing unit (CPU) executes some of instructions while other processing units execute other instructions. In at least one embodiment, different components of a computer system have separate processors and different processors execute different subsets of instructions.

In at least one embodiment, computer systems are configured to implement one or more services that singly or collectively perform operations of processes described herein and such computer systems are configured with applicable hardware and/or software that enable performance of operations. In at least one embodiment, a computer system that implements at least one embodiment of present disclosure is a single device or is a distributed computer system having multiple devices that operate differently such that distributed computer system performs operations described herein and such that a single device does not perform all operations.

In at least one embodiment, even though the above discussion provides at least one embodiment having implementations of described techniques, other architectures may be used to implement described functionality, and are intended to be within scope of this disclosure. In addition, although specific responsibilities may be distributed to components and processes, they are defined above for purposes of discussion, and various functions and responsibilities might be distributed and divided in different ways, depending on circumstances.

In at least one embodiment, although subject matter has been described in language specific to structures and/or methods or processes, it is to be understood that subject matter claimed in appended claims is not limited to specific structures or methods described. Instead, specific structures or methods are disclosed as example forms of how a claim may be implemented.

From all the above, a person of ordinary skill would readily understand that the tool of the present disclosure provides numerous technical and commercial advantages and can be used in a variety of applications. Various embodi-

The invention claimed is:

1. A system for downhole electrical logging, comprising:
a tool body;
an antenna arrangement located on the tool body, the antenna arrangement comprising two or more receiver antennas and two or more transmitter antennas; and
at least one processor within the tool body to execute instructions to cause the system to:
determining one or more compensated measurements from the antenna arrangement, wherein the one or more compensated measurements have a plurality of depths of investigations (DOIs), wherein a first number of DOIs in the plurality of DOIs is larger than a product of a second number that is of the two or more receiver antennas and that is divided by two, and of a third number that is of the two or more transmitter antennas and that is divided by two.

2. The system of claim 1, wherein the antenna arrangement is symmetric with respect to a midpoint of two of the two or more receiver antennas and two of the two or more transmitter antennas.

3. The system of claim 2, wherein the at least one processor executes the instructions to further cause the system to:
determine adjusted compensated measurements by averaging two or more of the one or more compensated measurements from mirrored asymmetric sub-arrangements of the antenna arrangement.

4. The system of claim 1, wherein the at least one processor executes the instructions to further cause the system to:
determine adjusted compensated measurements by averaging a plurality of the one or more compensated measurements, wherein the adjusted compensated measurements are spatially correlated to a logging depth in an underground formation.

5. The system of claim 3, wherein the two or more of the one or more compensated measurements from the mirrored asymmetric sub-arrangements of the antenna arrangement comprise a first compensated measurement acquired at a first time from a first asymmetric sub-arrangement of the antenna arrangement and a second compensated measurement acquired at a second time from a second asymmetric sub-arrangement of the antenna arrangement, wherein the first asymmetric sub-arrangement of the antenna arrangement is mirrored to the second asymmetric sub-arrangement of the antenna arrangement, and wherein a time difference between the first time and the second time is related to one or more distances between two of the two or more receiver antennas and the two or more transmitter antennas.

6. The system of claim 1, wherein the one or more compensated measurements are independent from at least one of an electronics term of the two or more receiver antennas and a specific magnetic moment of the two or more receiver antennas and the two or more transmitter antennas.

7. The system of claim 1, wherein the one or more compensated measurements are air hang corrected.

8. One or more processors to determine one or more compensated measurements from an antenna arrangement, wherein the antenna arrangement comprises two or more receiver antennas and two or more transmitter antennas on a tool body to be located in an underground formation, wherein the one or more compensated measurements have a plurality of depths of investigations (DOIs), wherein a first number of DOIs in the plurality of DOIs is larger than a product of a second number that is of the two or more receiver antennas and that is divided by two, and of a third number that is of the two or more transmitter antennas and that is divided by two.

9. The one or more processors of claim 8, wherein the antenna arrangement is symmetric with respect to a midpoint of the two or more receiver antennas and two of the two or more transmitter antennas.

10. The one or more processors of claim 9, further to determine adjusted compensated measurements by averaging two or more of the one or more compensated measurements from mirrored asymmetric sub-arrangements of the antenna arrangement.

11. The one or more processors of claim 8, further to determine adjusted compensated measurements by averaging a plurality of the one or more compensated measurements, wherein the adjusted compensated measurements are spatially correlated to a logging depth in the underground formation.

12. The one or more processors of claim 10, wherein the two or more of the one or more compensated measurements from the mirrored asymmetric sub-arrangements of the antenna arrangement comprise a first compensated measurement acquired at a first time from a first asymmetric sub-arrangement of the antenna arrangement and a second compensated measurement acquired at a second time from a second asymmetric sub-arrangement of the antenna arrangement, wherein the first asymmetric sub-arrangement of the antenna arrangement is mirrored to the second asymmetric sub-arrangement of the antenna arrangement, and wherein a time difference between the first time and the second time is related to one or more distances between two of the two or more receiver antennas and the two or more transmitter antennas.

13. The one or more processors of claim 8, wherein the one or more compensated measurements are independent from at least one of an electronics term of the two or more receiver antennas and a specific magnetic moment of the two or more receiver antennas and the two or more transmitter antennas.

14. A method to be used with a system for downhole electrical logging, the method comprising;
providing an antenna arrangement located on a tool body, the antenna arrangement comprising two or more receiver antennas and two or more transmitter antennas; and
executing instructions from a memory of the system and using at least one processor within the tool body and causing the system to:
determine one or more compensated measurements from the antenna arrangement, wherein the one or more compensated measurements have a plurality of depths of investigations (DOIs), wherein a first number of DOIs in the plurality of DOIs is larger than a product of a second number that is of the two or more receiver antennas and that is divided by two, and of a third number that is of the two or more transmitter antennas and that is divided by two.

15. The method of claim 14, wherein the antenna arrangement is symmetric with respect to a midpoint of two of the two or more receiver antennas and two of the two or more transmitter antennas.

16. The method of claim 14, wherein executing the instructions from the memory of the system and using the at least one processor within the tool body further causes the system to:
determine adjusted compensated measurements by averaging two or more of the one or more compensated measurements from mirrored asymmetric sub-arrangements of the antenna arrangement.

17. The method of claim 14, wherein executing the instructions from the memory of the system and using the at least one processor within the tool body further causes the system to:
determine adjusted compensated measurements by averaging a plurality of the one or more compensated measurements, wherein the adjusted compensated measurements are spatially correlated to a logging depth in an underground formation.

18. The method of claim 17, further comprising:
acquiring, using mirrored asymmetric sub-arrangements of the antenna arrangement, a first compensated measurement acquired at a first time from a first asymmetric sub-arrangement of the antenna arrangement, the first compensated measurement being part of two or more of the one or more compensated measurements; and
acquiring, using a second asymmetric sub-arrangement of the antenna arrangement, a second compensated measurement acquired at a second time, wherein the first asymmetric sub-arrangement of the antenna arrangement is mirrored to the second asymmetric sub-arrangement of the antenna arrangement, and wherein a time difference between the first time and the second time is related to one or more distances between two of the two or more receiver antennas and the two or more transmitter antennas.

19. The method of claim 14, wherein the one or more compensated measurements are independent from at least one of an electronics term of the two or more receiver antennas and a specific magnetic moment of the two or more receiver antennas and the two or more transmitter antennas.

20. The method of claim 14, wherein the one or more compensated measurements are air hang corrected.

* * * * *